(12) United States Patent
Li

(10) Patent No.: US 7,936,596 B2
(45) Date of Patent: May 3, 2011

(54) MAGNETIC TUNNEL JUNCTION CELL INCLUDING MULTIPLE MAGNETIC DOMAINS

(75) Inventor: Xia Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 532 days.

(21) Appl. No.: 12/024,157

(22) Filed: Feb. 1, 2008

(65) Prior Publication Data

US 2009/0194832 A1 Aug. 6, 2009

(51) Int. Cl.
*G11C 11/15* (2006.01)
(52) U.S. Cl. ........ 365/173; 365/158; 365/130; 365/148; 977/935
(58) Field of Classification Search .................... 365/48, 365/55, 62, 66, 74, 78, 80–93, 100, 130, 365/131, 148, 158, 171–173, 225.5, 243.5; 216/22; 257/421, E21.665; 438/3; 428/810–816, 428/817–825.1, 826; 977/933–935
See application file for complete search history.

(56) References Cited

U.S. PATENT DOCUMENTS

| | | | |
|---|---|---|---|
| 6,072,718 A | 6/2000 | Abraham et al. | |
| 6,621,730 B1 | 9/2003 | Lage | |
| 7,109,539 B2 | 9/2006 | Lu | |
| 7,221,584 B2 | 5/2007 | Liu et al. | |
| 2006/0023492 A1* | 2/2006 | Min et al. | 365/158 |
| 2008/0117552 A1* | 5/2008 | Zhou et al. | 360/319 |

FOREIGN PATENT DOCUMENTS

EP 1826771 A1 8/2007

OTHER PUBLICATIONS

FreeScale Semiconductor, Inc.; MRAM Fact Sheet; Document No. MRAMTECHFS, Rev. 6, 2007.
Hiromitsu Kimura, Kostas Pagiamtzis, Ali Sheikholeslami and Takahiro Hanyu; A Study of Multiple-Valued Magnetoresistive RAM (MRAM) Using Binary MTJ Devices; Graduate school of Information Sciences, Tohoku University; Department of Electrical and Computer Engineering, University of Toronto, Aug. 2004.
W.J. Gallagher and S.S.P. Parkin; Development of the Magnetic Tunnel Junction MRAM at IBM: From First Junctions to a 16-Mb MRAM Demonstrator Chip; IBM J. Res. & Dev.; vol. 50, No. 1; Jan. 2006.
International Search Report And The Written Opinion—PCT/US2009/032209, International Search Authority—European Patent Office—May 15, 2009.

* cited by examiner

*Primary Examiner* — Richard Elms
*Assistant Examiner* — Harry W Byrne
(74) *Attorney, Agent, or Firm* — Sam Talpalatsky; Nicholas J. Pauley; Jonathan T. Velasco

(57) ABSTRACT

In a particular embodiment, a magnetic tunnel junction (MTJ) structure is disclosed that includes an MTJ cell having multiple sidewalls that extend substantially normal to a surface of a substrate. Each of the multiple sidewalls includes a free layer to carry a unique magnetic domain. Each of the unique magnetic domains is adapted to store a digital value.

25 Claims, 21 Drawing Sheets

MAGNETIC TUNNEL JUNCTION CELL INCLUDING MULTIPLE MAGNETIC DOMAINS

I. FIELD

The present disclosure is generally related to a magnetic tunnel junction cell including multiple magnetic domains.

II. DESCRIPTION OF RELATED ART

In general, widespread adoption of portable computing devices and wireless communication devices has increased demand for high-density and low-power non-volatile memory. As process technologies have improved, it has become possible to fabricate magneto-resistive random access memory (MRAM) based on magnetic tunnel junction (MTJ) devices. Traditional spin torque tunnel (STT) junction devices are typically formed as flat stack structures. Such devices typically have two-dimensional magnetic tunnel junction (MTJ) cells with a single magnetic domain. An MTJ cell typically includes a fixed magnetic layer, a barrier layer (i.e., a tunneling oxide layer), and a free magnetic layer, where a bit value is represented by a magnetic field induced in the free magnetic layer and an anti-ferromagnetic layer. A direction of the magnetic field of the free layer relative to a direction of a fixed magnetic field carried by the fixed magnetic layer determines the bit value.

Conventionally, to improve data density using MTJ devices, one technique includes reducing the size of MTJ devices to put more MTJ devices in a smaller area. However, the size of the MTJ devices is limited by the critical dimension (CD) of fabrication technology. Another technique involves forming multiple MTJ structures in a single MTJ device. For example, in one instance, a first MTJ structure is formed that includes a first fixed layer, a first tunnel barrier, and a first free layer. A dielectric material layer is formed on the first MTJ structure, and a second MTJ structure is formed on top of the dielectric material layer. Such structures increase the density of storage in an X-Y direction while increasing a size of the memory array in a Z-direction. Unfortunately, such structures store only one bit per cell, so the data density in the X-Y direction is increased at the expense of area in a Z-direction and increased manufacturing costs. Further, such structures increase wire-trace routing complexity. Hence, there is a need for improved memory devices with greater storage density without increasing a circuit area of each of the MTJ cells and that can scale with the process technology.

III. SUMMARY

In a particular embodiment, a magnetic tunnel junction (MTJ) structure is disclosed that includes an MTJ cell having multiple sidewalls that extend substantially normal to a surface of a substrate. Each of the multiple sidewalls includes a free layer to carry a unique magnetic domain. Each of the unique magnetic domains is adapted to represent a stored digital value.

In another particular embodiment, a magnetic tunnel junction (MTJ) structure is disclosed that includes an MTJ cell having multiple sidewalls. The multiple sidewalls include a first sidewall having a first free layer to carry a first magnetic domain to store a first data bit and include a second sidewall having a second free layer to carry a second magnetic domain to store a second data bit.

In still another particular embodiment, a magnetic random access memory (MRAM) includes an array of magnetic tunnel junction (MTJ) cells. Each of the MTJ cells includes multiple sidewalls. Each of the multiple sidewalls includes a free layer to carry a respective independent magnetic domain adapted to store a digital value.

One particular advantage provided by embodiments of the magnetic tunnel junction (MTJ) device is provided in that multiple data bits may be stored at a single MTJ cell. For example, a single MTJ cell may be configured to store up to four data bits, which may be used to represent up to sixteen logic states in each MTJ cell.

Another particular advantage is provided in that the multiple-bit MTJ cell can scale with process technology, allowing for multiple bits per MTJ cell even as the MTJ cell size decreases.

Still another particular advantage is provided in that the MTJ cell can include multiple independent magnetic domains to store data bits. In a particular embodiment, the MTJ cell can include one or more sidewalls (extending vertically from a planar surface of a substrate), where each of the one or more sidewalls carries a unique lateral magnetic domain to store a data bit. Additionally, the MTJ cell can include a bottom wall including a horizontal magnetic domain to store another data bit. In general, the MTJ cell may include one, two or three sidewalls. In a particular example, the MTJ cell can include four sidewalls and a bottom wall. In a one sidewall example, the sidewall can be located on any side without restriction. In a two sidewall example, the sidewalls may be located on opposing sides or on adjacent sides.

Yet another particular advantage is provided in that the MTJ cell can include multiple independent magnetic domains that may be written to or read from without changing data stored at other magnetic domains within the MTJ cell.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
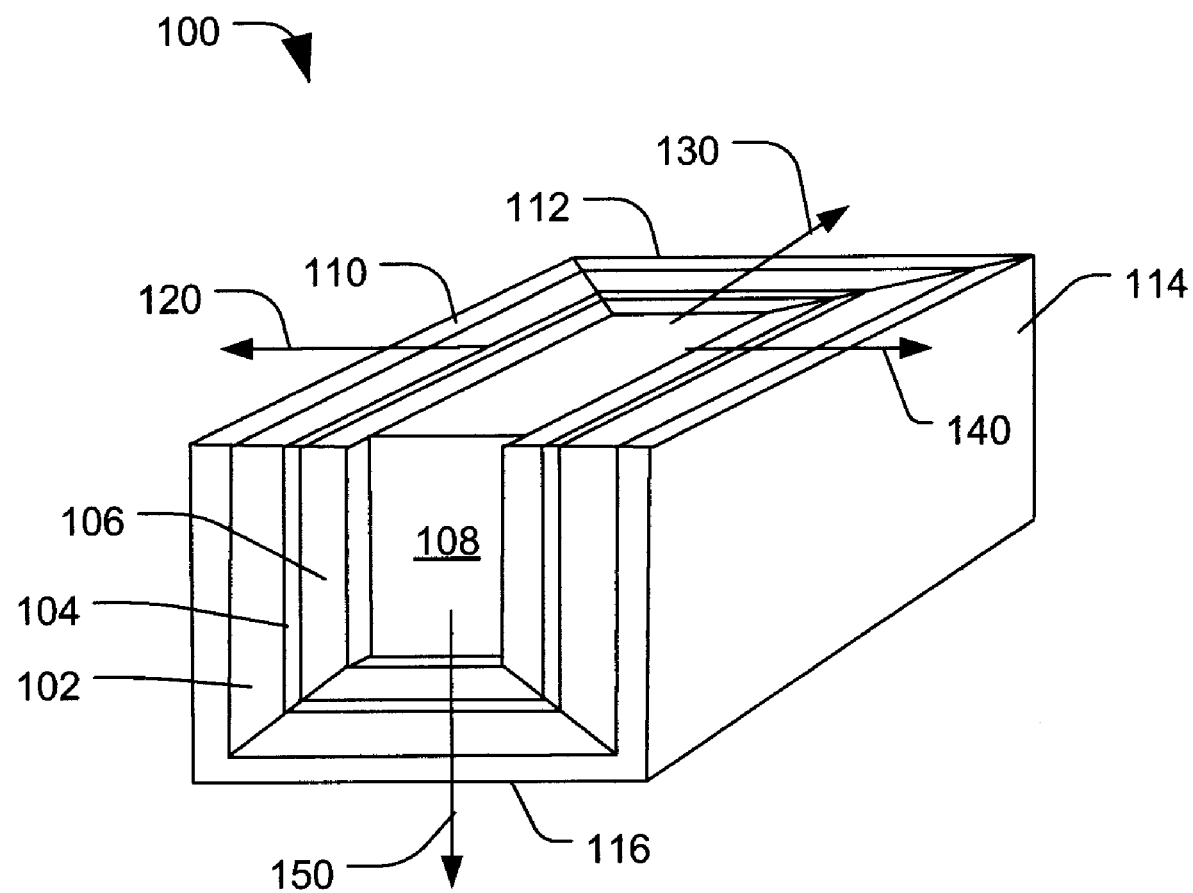
FIG. 1 is a perspective view of a particular illustrative embodiment of a magnetic tunnel junction (MTJ) cell that can be used to store multiple data bits.

FIG. 1 is a perspective view of a particular illustrative embodiment of a magnetic tunnel junction (MTJ) cell 100 that can be used to store multiple data bits. The MTJ cell 100 includes a magnetic tunnel junction (MTJ) stack having a fixed magnetic layer 102, a tunnel junction layer 104, and a free magnetic layer 106 arranged in a substantially rectangular shape. An electrode layer having a first sidewall portion 110, a second sidewall portion 112, a third sidewall portion 114 and a bottom wall portion 116 is electrically and physically coupled to the fixed magnetic layer 102 via an anti-ferromagnetic (AF) layer (not shown). A center electrode 108 is electrically and physically coupled to the free layer 106. In a particular embodiment, a voltage may be applied to the center electrode 108 and an electrical current may flow from the center electrode 108 through the free layer 106, across the tunnel junction 104, and through the fixed layer 102. The electrical current may flow as indicated by the arrows 120, 130, 140, and 150.

In a particular illustrative embodiment, the free layer 106 may carry multiple independent magnetic domains, each of which may be independently configured by a write current to orient a direction of a magnetic field within the free layer 106 relative to a fixed magnetic field associated with the fixed layer 102 to represent a data value, such as a bit value. In particular, when a direction (orientation) of a magnetic field of the fixed layer 102 and the direction of the magnetic field of the free layer 106 are aligned, a bit value of "0" is represented. In contrast, when a direction (orientation) of the magnetic field of the free layer 106 is opposite to the direction of the magnetic field of the fixed layer 102, a bit value of "1" is represented. A bit "0" state and a bit "1" state may exhibit different resistances, and the bit state may be read by detecting a resistance value or a current value. In a particular embodiment, the bit "0" state has a lower resistance. A direction of a magnetic field associated with the free layer 106 that is adjacent to the sidewall 110 may represent a first bit value. A direction of a magnetic field associated with the free layer 106 that is adjacent to the sidewall 112 may represent a second bit value. A direction of a magnetic field associated with the free layer 106 that is adjacent to the sidewall 114 may represent a third bit value. A direction of a magnetic field associated with the free layer 106 that is adjacent to the bottom wall 116 may represent a fourth bit value.

In a particular embodiment, a magnetic domain represents a physical region of magnetic material that carries a magnetic field having a homogenous magnetic orientation. An interface between two magnetic domains may be called a domain wall. The fixed layer 102 may have multiple fixed magnetic domains and associated domain walls. The magnetic domains of the fixed layer 102 are "pinned" by an anti-ferromagnetic layer after a magnetic anneal (i.e., a fixed layer magnetic orientation is fixed by the AF layer during fabrication by application of an external magnetic field during a magnetic annealing process). In a particular embodiment, additional layers between the center electrode 108 and the free layer 106 may enhance MTJ performance. In a particular embodiment, the MTJ stack may include additional layers. For example, a synthetic fixed layer or synthetic free (SyF) layer structure may include two fixed layers and one spacer layer or two free layers and one spacer layer, respectively. A dual spin filter (DSP) structure may include two anti-ferromagnetic layers and pinned layers. In an alternate embodiment, the sequence of MTJ film stack layers can be reversed.

Figure 2:
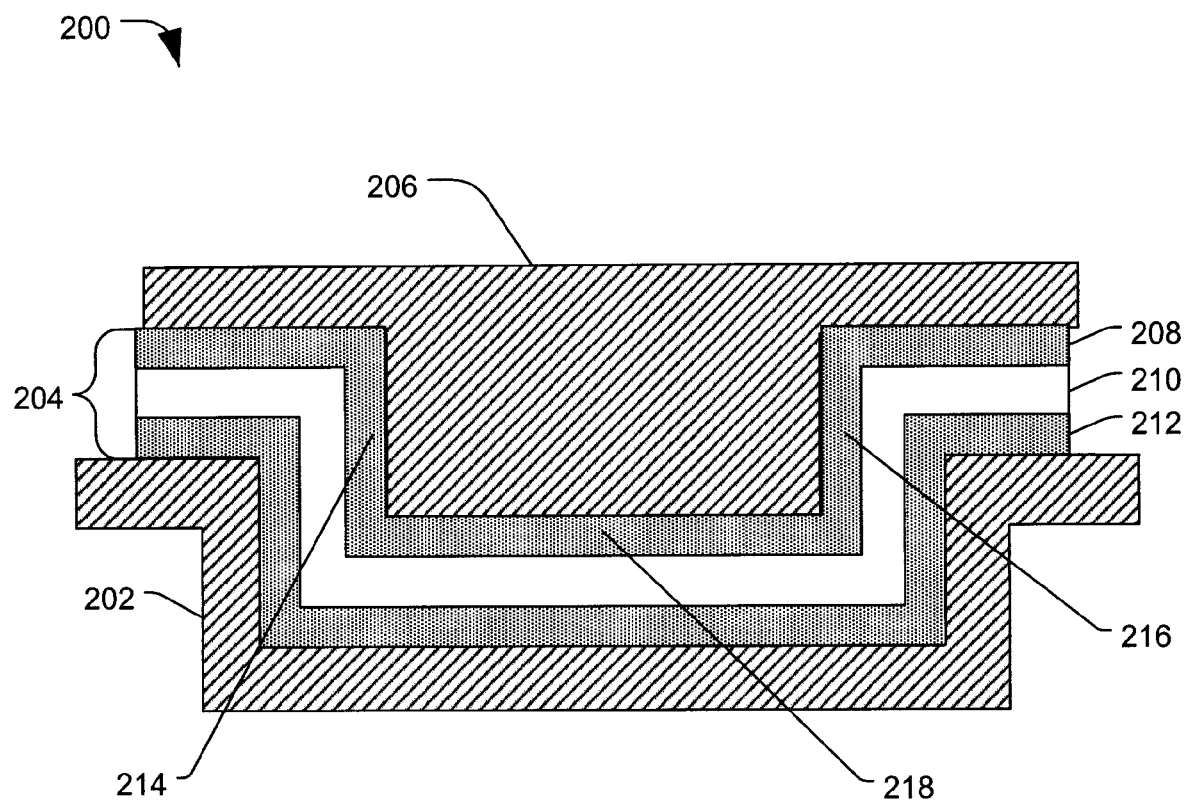
FIG. 2 is a cross-sectional view of a magnetic tunnel junction cell that is adapted to store multiple data bits.

FIG. 2 is a cross-sectional view of a magnetic tunnel junction (MTJ) cell 200 that is adapted to store multiple data values, such as multiple bits. The MTJ cell 200 includes a bottom electrode layer 202, a magnetic tunnel junction (MTJ) stack 204, and a top electrode layer 206. The MTJ stack 204 includes a free magnetic layer 208 that carries a magnetic field, which may be programmed by applying a write current between the top electrode 206 and the bottom electrode 202. The MTJ stack 204 also includes a tunnel junction barrier layer 210 and a fixed magnetic layer 212. An anti-ferromagnetic (AF) layer (not shown) may be located between the bottom electrode 202 and the fixed layer 212. In a particular embodiment, the MTJ structure may include additional layers (not shown). For example, synthetic fixed layer or synthetic free (SyF) layer structures may include two fixed layers and one spacer layer or two free layers and one spacer layer, respectively. Dual spin filter (DSP) structures may include two anti-ferromagnetic layers and pinned layers. In addition, in an alternate embodiment, the sequence of MTJ film stack may also be reversed.

The fixed layer 212 is generally annealed and may be pinned by an anti-ferromagnetic (AF) layer (not shown) to fix a direction of a magnetic field that is carried by the fixed layer 212. The tunnel barrier 210 may be an oxide layer (MgO, $Al_2O_3$, etc) or other diamagnetic layer that is adapted to provide a tunnel junction or barrier between the fixed layer 212 and the free layer 208. The free layer 208 is formed from a ferromagnetic material that carries a programmable (writeable) magnetic domain, which can be altered to store a bit value (i.e., a "1" or a "0" bit value).

In a particular embodiment, the free layer 208 of the MTJ stack 204 may be adapted to carry multiple independent magnetic domains. For example, the free layer 208 at a first sidewall 214 may store a first bit value. The free layer 208 at a second sidewall 216 may store a second bit value. The free layer 208 at a bottom wall 218 may store a third bit value. The particular orientation of the magnetic field within the free layer at the sidewalls 214 and 216 and at the bottom wall 218 may be controlled, in part, by controlling length, width, and depth dimensions of the MTJ cell 200. In general, a magnetic field orients in a longitudinal direction along a length of a wall of the MTJ cell 200.

Figure 3:
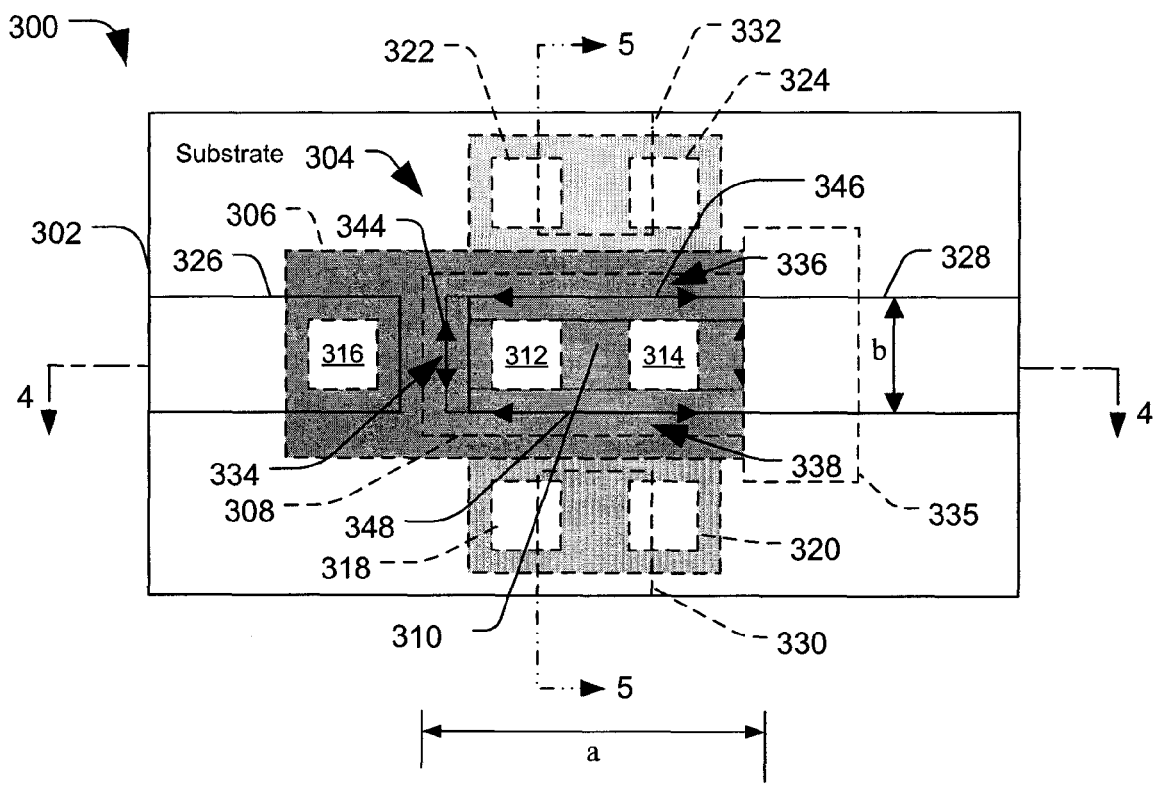
FIG. 3 is a top view of a particular illustrative embodiment of a memory device including a magnetic tunnel junction (MTJ) cell that is adapted to store multiple data bits.

FIG. 3 is a top view of a particular illustrative embodiment of a memory device 300 including a substrate 302 having a magnetic tunnel junction (MTJ) cell 304 that is adapted to store multiple bits. The substrate 302 includes a magnetic tunnel junction (MTJ) structure 304 that has a bottom electrode 306, an MTJ stack 308, and a center electrode 310. In a particular embodiment, the center electrode 310 may extend between the sidewalls 334, 336, and 338 of the MTJ stack 308 such that a thickness of the center electrode 310 is approximately half of a difference between a smaller of a width (b) or a length (a) of the trench minus a width of opposing sidewalls of the MTJ stack 308, such as the second and third sidewalls 336 and 338. In a particular embodiment, the thickness of the center electrode layer may be greater than half the distance between the smaller of the width and the length minus the width of the opposing sidewalls. Selecting an appropriate thickness of the center electrode layer may enable a top surface of the center electrode to be substantially flat without a gap or seam.

The MTJ structure 304 has a length (a) and a width (b), where the length (a) is greater than the width (b). The substrate 302 includes a first center via 312 and a second center via 314 that are coupled to the center electrode 310. The substrate 302 also includes a first lateral via 316, a second lateral via 318, a third lateral via 320, a fourth lateral via 322, and a fifth lateral via 324 to access the MTJ structure 304. The substrate 302 also includes a first wire trace 326 coupled to the first lateral via 316, a second wire trace 328 coupled to the first and second center vias 312 and 314, a third wire trace 330 coupled to the second and third lateral vias 318 and 320, and a fourth wire trace 332 coupled to the fourth and fifth lateral vias 322 and 324. The substrate 302 also includes a process opening 335 to remove one sidewall.

The MTJ stack 308 includes a fixed magnetic layer that may be pinned by an anti-ferromagnetic (AF) layer (not shown) and that carries a fixed magnetic domain having a fixed orientation, a tunnel barrier layer, and a free magnetic layer having a magnetic domain that can be changed or programmed via a write current. In a particular embodiment, the fixed magnetic layer of the MTJ stack 308 may include one or more layers. The MTJ stack 308 includes a first sidewall 334 to carry a first magnetic domain 344 in a first portion of the free layer, a second sidewall 336 to carry a second magnetic domain 346 in a second portion of the free layer, and a third sidewall 338 to carry a third magnetic domain 348 in a third portion of the free layer. The first, second and third magnetic domains 344, 346, and 348 are independent and adapted to represent data values. In a particular embodiment, the first magnetic domain 344 is adapted to represent a first bit value, the second magnetic domain 346 is adapted to represent a second bit value, and the third magnetic domain 348 is adapted to represent a third bit value. In general, the orientation of the magnetic domains 344, 346, and 348 is determined by the stored bit value. For example, a "0" value is represented by a first orientation while a "1" value is represented by a second orientation. In a particular embodiment, a "0" value and a "1" value may be represented by a parallel or anti-parallel orientation with the fixed layer, respectively.

Figure 4:
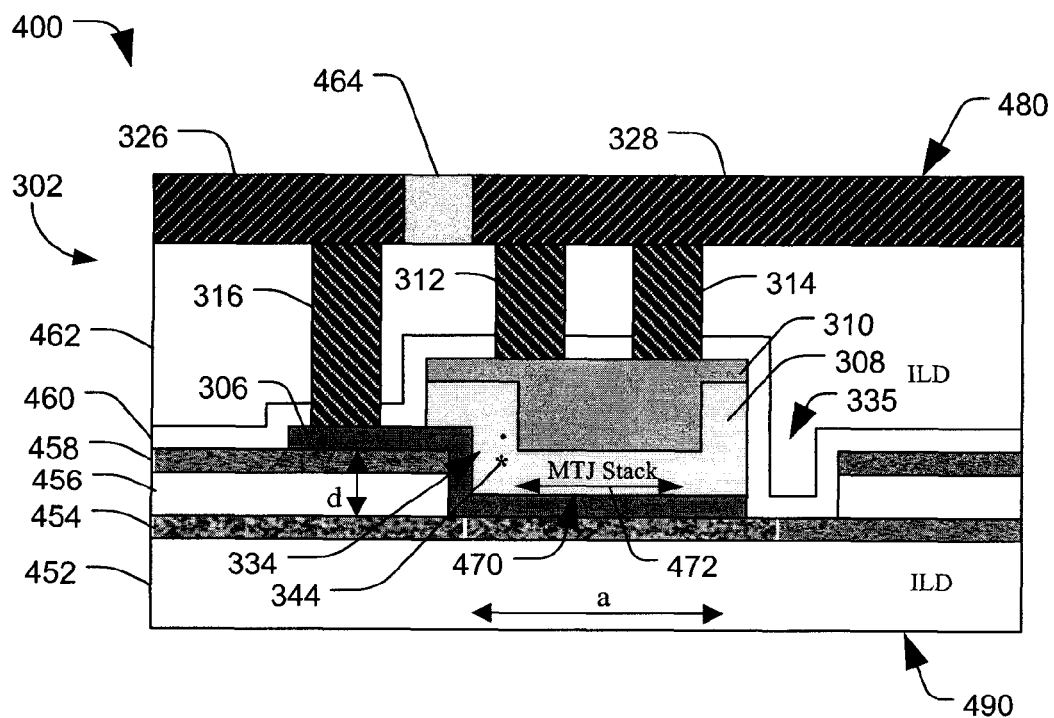
FIG. 4 is a cross-sectional view of the memory device of FIG. 3 taken along line 4-4 in FIG. 3.

FIG. 4 is a cross-sectional diagram 400 of the circuit device 300 of FIG. 3 taken along line 4-4 in FIG. 3. The diagram 400 illustrates the substrate 302 including a first inter-layer dielectric layer 452, a first cap layer 454, a second inter-layer dielectric layer 456, a second cap layer 458, a third cap layer 460, a third inter-layer dielectric layer 462, and a fourth inter-layer dielectric layer 464. The substrate 302 has a first surface 480 and a second surface 490. The substrate 302 also includes the MTJ structure 304 including the MTJ stack 308. The bottom electrode 306 and the MTJ stack 308 are disposed within a trench in the substrate 302. The trench has a depth (d). The substrate 302 includes the first and second wire traces 326 and 328 disposed and patterned at the first surface 480. The first wire trace 326 is coupled to the first lateral via 316, which extends from the first wire trace 326 to a portion of the bottom electrode 306. The second wire trace 328 is coupled to the first and second center vias 312 and 314, which extend from the second wire trace 328 to the center electrode 310. The center electrode 310 is coupled to the MTJ stack 308. The substrate 302 also includes the process opening 335, which may be formed by selectively removing a portion of the MTJ structure 304 and by depositing a cap film and an inter-layer dielectric material within the processing opening 335.

In a particular embodiment, the MTJ stack 308 includes the first sidewall 334, which carries the first magnetic domain 344 in the first portion of the free layer. The first magnetic domain 344 is adapted to represent the first bit value. The MTJ stack 308 also includes a bottom wall 470 having a bottom magnetic domain 472 in a bottom portion of the free layer, which is adapted to represent a fourth bit value. A bit value can be read from the MTJ stack 308 by applying a voltage to the second wire trace 328 and by comparing a current at the first wire trace 326 to a reference current. Alternatively, a bit value may be written to the MTJ stack 308 by applying a write current between the first and second wire traces 326 and 328. In a particular embodiment, the length (a) and the width (b) of the MTJ stack 308 illustrated in FIG. 3 are greater than the trench depth (d), and the magnetic domain 344 carried by the first sidewall 334 extends in a direction that is substantially parallel to the first surface 480 of the substrate 302 and in a direction of the width (b) illustrated in FIG. 3. In the particular view of FIG. 4, the magnetic domain 344 extends normal to the page view (outward from the page as indicated by an arrow head ("•") or into the page as indicated by a tail of an arrow ("*")).

Figure 5:
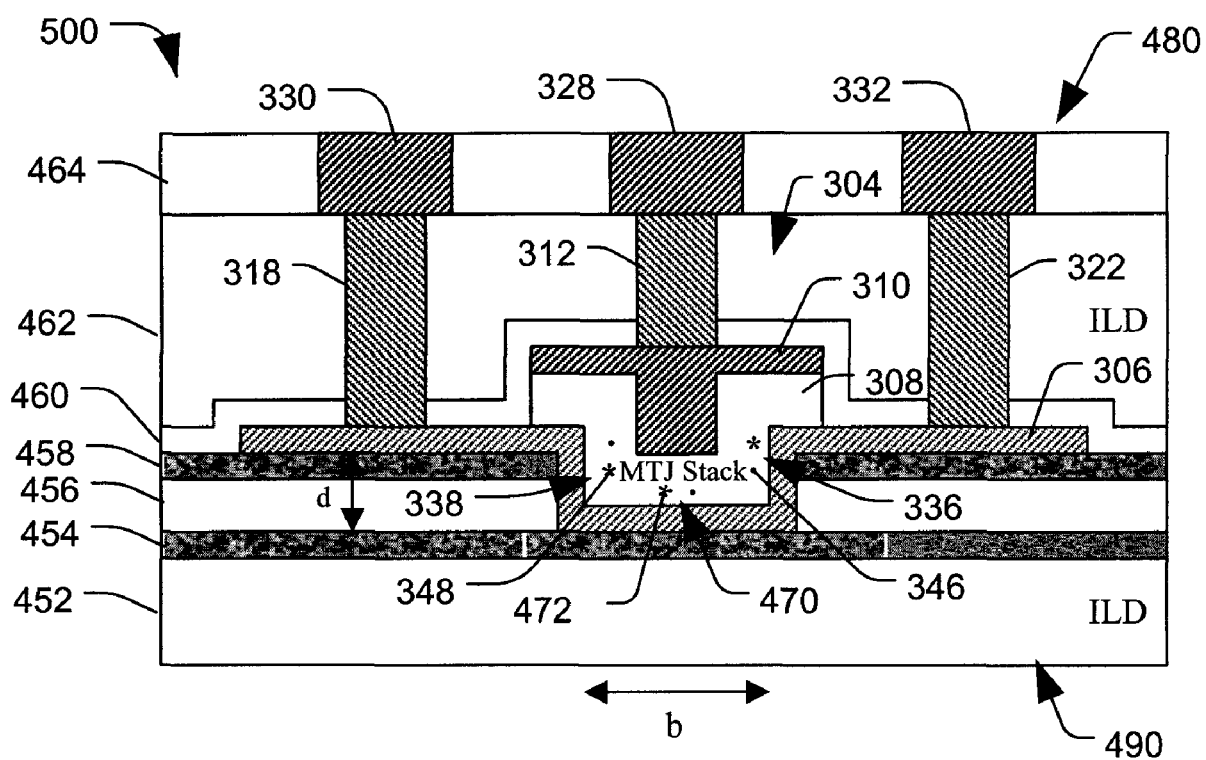
FIG. 5 is a cross-sectional view of the memory device of FIG. 3 taken along line 5-5 in FIG. 3.

FIG. 5 is a cross-sectional diagram 500 of the circuit device 300 of FIG. 3 taken along line 5-5 in FIG. 3. The diagram 500 includes the substrate 302 having the first inter-layer dielectric layer 452, the first cap layer 454, the second inter-layer dielectric layer 456, the second cap layer 458, the third cap layer 460, the third inter-layer dielectric layer 462, and the fourth inter-layer dielectric layer 464. The substrate 302 includes the MTJ structure 304 having the bottom electrode 306, the MTJ stack 308, and the center electrode 310. The substrate 302 includes the third wire trace 330 coupled to the second lateral via 318, which extends from the third wire trace 330 to a first portion of the bottom electrode 306. The substrate 302 also includes the second wire trace 328 coupled to the center via 312, which extends from the second wire trace 328 to the center electrode 310. The substrate 302 further includes the fourth wire trace 332 coupled to the fourth lateral via 322, which extends from the fourth wire trace 332 to a second portion of the bottom electrode 306. The MTJ stack 308 includes the second sidewall 336 to carry the second magnetic domain 346 in the second portion of the free layer, the third sidewall 338 to carry the third magnetic domain 348 in the third portion of the free layer, and the bottom wall 470 to carry the bottom magnetic domain 472 in the bottom portion of the free layer.

In a particular embodiment, the MTJ stack 308 is adapted to store up to four unique data values, such as four unique bit values. A first bit value may be represented by the first magnetic domain 344, a second bit value may be represented by the second magnetic domain 346, a third bit value may be represented by the third magnetic domain 348, and a fourth bit value may be represented by the bottom magnetic domain 472. In another particular embodiment, a fourth sidewall may be included to carry a fourth magnetic domain, which may represent a fifth bit value.

Figure 6:
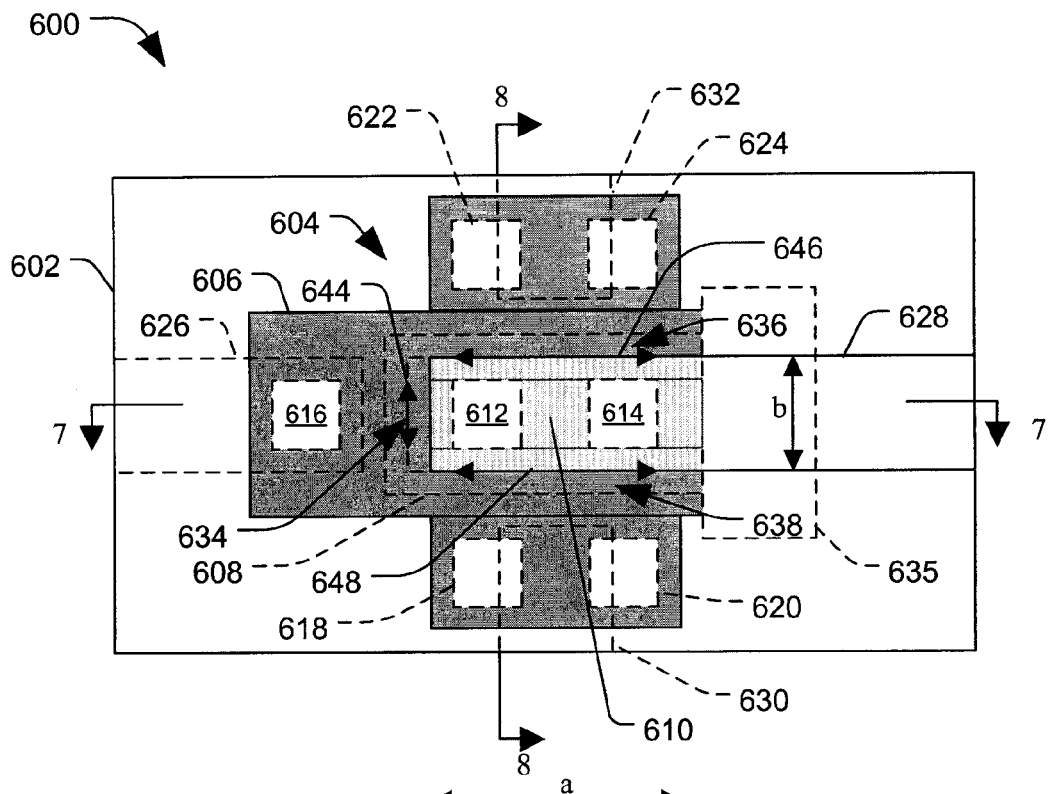
FIG. 6 is a top view of a second particular illustrative embodiment of a memory device including a magnetic tunnel junction (MTJ) cell that is adapted to store multiple data bits.

FIG. 6 is a top view of a particular illustrative embodiment of a memory device 600 including a substrate 602 with having a magnetic tunnel junction (MTJ) cell 604 that is adapted to store multiple bits. The substrate 602 includes a magnetic tunnel junction (MTJ) structure 604 that has a bottom electrode 606, an MTJ stack 608, and a center electrode 610. The MTJ structure 604 has a length (a) and a width (b), where the length (a) is greater than the width (b). The substrate 602 includes a first center via 612 and a second center via 614 that are coupled to the center electrode 610. The substrate 602 also includes a first lateral via 616, a second lateral via 618, a third lateral via 620, a fourth lateral via 622, and a fifth lateral via 624 to access the MTJ structure 604. The substrate 602 also includes a first wire trace 626 coupled to the first lateral via 616, a second wire trace 628 coupled to the first and second center vias 612 and 614, a third wire trace 630 coupled to the second and third lateral vias 618 and 620, and a fourth wire trace 632 coupled to the fourth and fifth lateral vias 622 and 624. The substrate 602 also includes a process opening 635 to remove potion of sidewall of MTJ.

The MTJ stack 608 includes a fixed (pinned by AF layer (not shown)) magnetic layer that carries a fixed magnetic domain having a fixed orientation, a tunnel barrier layer, and a free magnetic layer having a magnetic domain that can be changed or programmed via a write current. In a particular embodiment, the fixed magnetic layer of the MTJ stack 608 may include one or more layers than depicted in FIGS. 1 & 2. The MTJ stack 608 includes a first sidewall 634 to carry a first magnetic domain 644 in a first portion of the free layer, a second sidewall 636 to carry a second magnetic domain 646 in a second portion of the free layer, and a third sidewall 638 to carry a third magnetic domain 648 in a third portion of the free layer. The first, second and third magnetic domains 644, 646, and 648 are independent and adapted to store data values. In a particular embodiment, the first magnetic domain 644 is adapted to represent a first bit value, the second magnetic domain 646 is adapted to represent a second bit value, and the third magnetic domain 648 is adapted to represent a third bit value. In general, the orientation of the magnetic domains 644, 646, and 648 is determined by the stored bit value. For example, a "0" value is represented by a first orientation while a "1" value is represented by a second orientation. In a particular embodiment, a "0" value and a "1" value may be represented by a parallel or anti-parallel orientation with the fixed layer, respectively.

Figure 7:
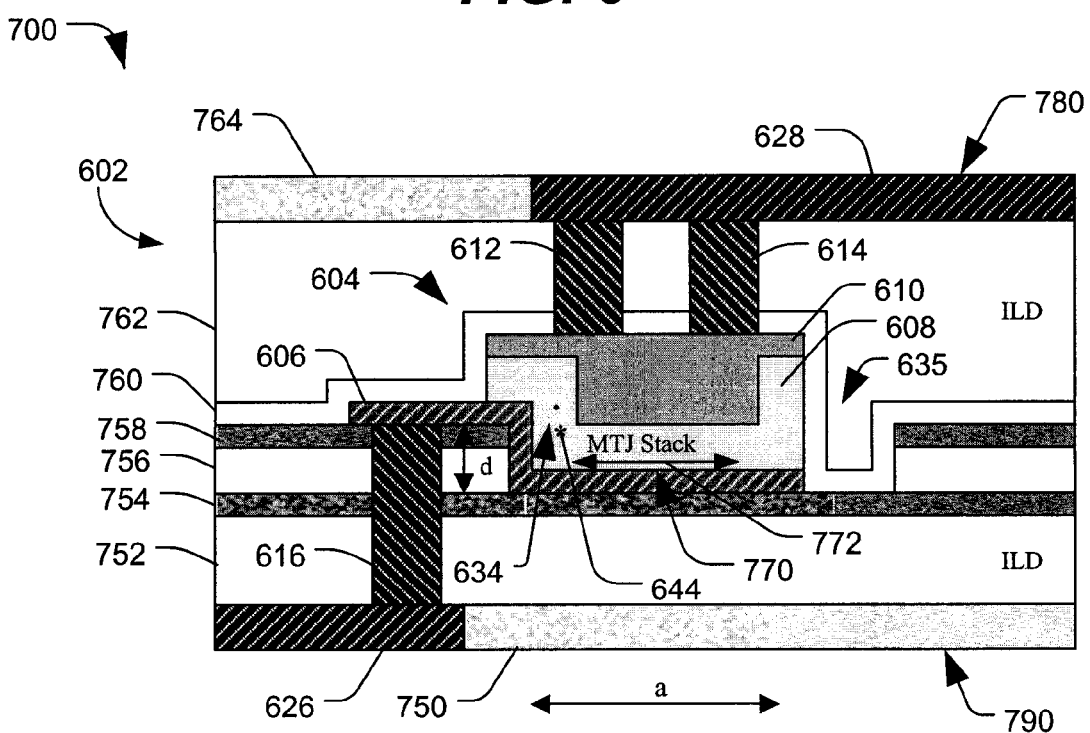
FIG. 7 is a cross-sectional view of the second embodiment of the memory device of FIG. 6 taken along line 7-7 in FIG. 6.

FIG. 7 is a cross-sectional diagram 700 of the circuit device 600 of FIG. 6 taken along line 7-7 in FIG. 6. The diagram 700 includes the substrate 602 having a first inter-layer dielectric layer 750, a second inter-layer dielectric layer 752, a first cap layer 754, a third inter-layer dielectric layer 756, a second cap layer 758, a third cap layer 760, a fourth inter-layer dielectric layer 762, and a fifth inter-layer dielectric layer 764. The substrate 602 has a first surface 780 and a second surface 790. The substrate 602 also includes the MTJ structure 604 including the MTJ stack 608. The bottom electrode 606 and the MTJ stack 608 are disposed within a trench in the substrate 602. The trench has a depth (d).

The substrate 602 includes the first wire trace 626 disposed and patterned at the second surface 790. The first wire trace 626 is coupled to the first lateral via 616, which extends from the first wire trace 626 to a portion of the bottom electrode 606. The substrate 602 also includes the second wire traces 628 disposed and patterning at the first surface 780. The second wire trace 628 is coupled to the first center via 612 and 614, which extend from the second wire trace 628 to the center electrode 610. The center electrode 610 is coupled to the MTJ stack 608. The substrate 602 also includes the process opening 635, which may be formed by selectively removing a portion of the MTJ structure 604 and by depositing a cap film and an inter-layer dielectric material within the processing opening 635.

In a particular embodiment, the MTJ stack 608 includes the first sidewall 634, which carries the first magnetic domain 644 in the first portion of the free layer. The first magnetic domain 644 is adapted to represent the first bit value. The MTJ stack 608 also includes a bottom wall 770 having a bottom magnetic domain 772 in a bottom portion of the free layer, which is adapted to represent a fourth bit value. In a particular example, a bit value can be read from the MTJ stack 608 by applying a voltage to the second wire trace 628 and by comparing a current at the first wire trace 626 to a reference current. Alternatively, a bit value may be written to the MTJ stack 608 by applying a write current between the first and second wire traces 626 and 628. In a particular embodiment, the length (a) and the width (b) of the MTJ stack 608 illustrated in FIG. 6 are greater than the trench depth (d), and the magnetic domain 644 carried by the first sidewall 634 extends in a direction that is substantially parallel to the first surface 780 of the substrate 602 and in a direction of the width (b) illustrated in FIG. 6. In the particular view of FIG. 7, the magnetic domain 644 extends normal to the page view (outward from the page as indicated by an arrow head ("•") or into the page as indicated by a tail of an arrow ("*")).

Figure 8:
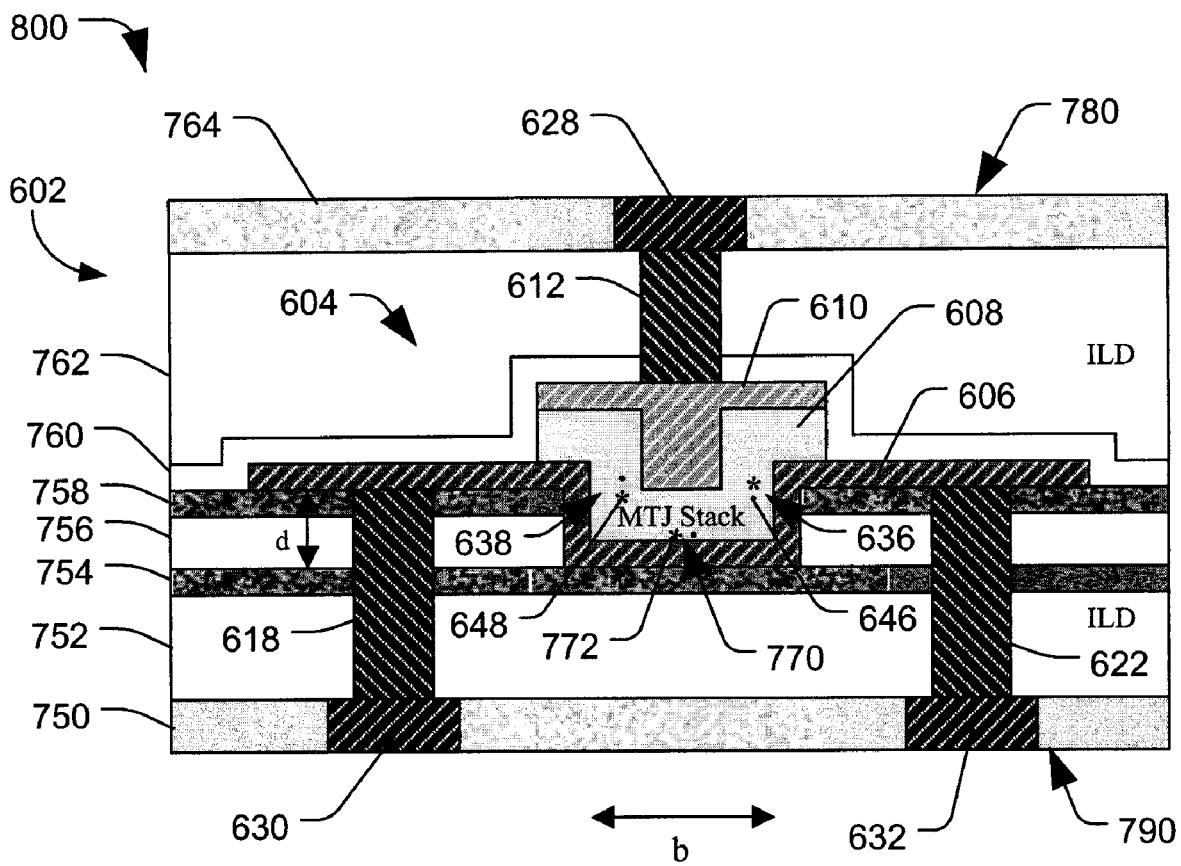
FIG. 8 is a cross-sectional view of the second embodiment of the memory device of FIG. 6 taken along line 8-8 in FIG. 6.

FIG. 8 is a cross-sectional diagram 800 of the circuit device 600 of FIG. 6 taken along line 8-8 in FIG. 6. The diagram 800 includes the substrate 602 having a first inter-layer dielectric layer 750, a second inter-layer dielectric layer 752, a first cap layer 754, a third inter-layer dielectric layer 756, a second cap layer 758, a third cap layer 760, a fourth inter-layer dielectric layer 762, and a fifth inter-layer dielectric layer 764. The substrate 602 has a first surface 780 and a second surface 790. The substrate 602 includes the MTJ structure 604 having the bottom electrode 606, the MTJ stack 608, and the center electrode 610. The substrate 602 includes the third wire trace 630 disposed at the second surface 790. The third wire trace 630 is coupled to the second lateral via 618, which extends from the third wire trace 630 to a first portion of the bottom electrode 606. The substrate 602 also includes the second wire trace 628 at the first surface 780. The second wire trace 628 is coupled to the center via 612, which extends from the second wire trace 628 to the center electrode 610. The substrate 602 further includes the fourth wire trace 632 at the second surface 790. The fourth wire trace is coupled to the fourth lateral via 622, which extends from the fourth wire trace 632 to a second portion of the bottom electrode 606. The MTJ stack 608 includes the second sidewall 636 to carry the second magnetic domain 646 in the second portion of the free layer, the third sidewall 638 to carry the third magnetic domain 648 in the third portion of the free layer, and the bottom wall 770 to carry the bottom magnetic domain 772 in the bottom portion of the free layer.

In a particular embodiment, the MTJ stack 608 is adapted to store up to four unique data values. A first bit value may be represented by the first magnetic domain 644 in the first portion of the free layer, a second bit value may be represented by the second magnetic domain 646 in the second portion of the free layer, a third bit value may be represented by the third magnetic domain 648 in the third portion of the free layer, and a fourth bit value may be represented by the bottom magnetic domain 772 in the bottom portion of the free layer. In another particular embodiment, a fourth sidewall may be included to carry a fourth magnetic domain, which may represent a fifth bit value.

Figure 9:
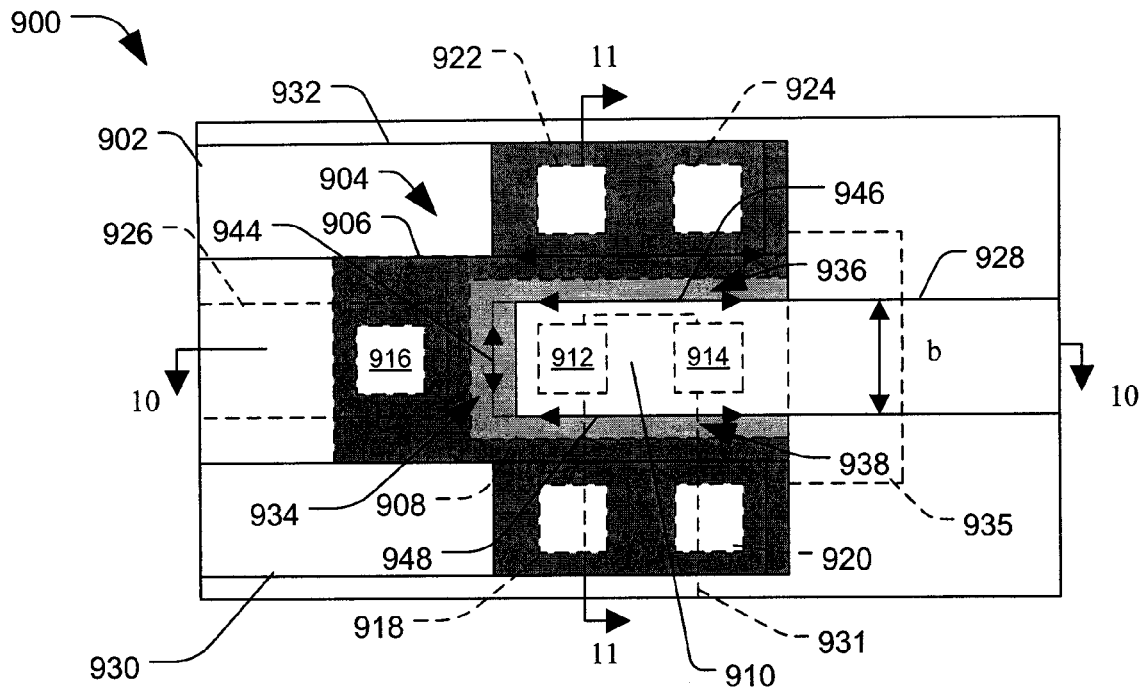
FIG. 9 is a top view of a third particular illustrative embodiment of a memory device including a magnetic tunnel junction (MTJ) cell that is adapted to store multiple bits.

FIG. 9 is a top view of a particular illustrative embodiment of a memory device 900 including a substrate 902 with having a magnetic tunnel junction (MTJ) cell 904 that is adapted to store multiple data bits. The substrate 902 includes a magnetic tunnel junction (MTJ) structure 904 that has a bottom electrode 906, an MTJ stack 908, and a center electrode 910. The MTJ structure 904 has a length (a) and a width (b), where the length (a) is greater than the width (b). The substrate 902 includes a first center via 912 and a second center via 914 that are coupled to the center electrode 910. The substrate 902 also includes a first lateral via 916, a second lateral via 918, a third lateral via 920, a fourth lateral via 922, and a fifth lateral via 924 to access the MTJ structure 904. The substrate 902 also includes a first wire trace 926 coupled to the first lateral via 916, a second wire trace 928 coupled to the first and second center vias 912 and 914, a third wire trace 930 coupled to the second and third lateral vias 918 and 920, a fourth wire trace 932 coupled to the fourth and fifth lateral vias 922 and 924, and a fifth wire trace 931. The substrate 902 also includes a process opening 935 to remove a portion of MTJ sidewall.

The MTJ stack 908 includes a fixed magnetic layer that may be pinned by an anti-ferromagnetic (AF) layer (not shown) and that carries a fixed magnetic domain having a fixed orientation, a tunnel barrier layer, and a free magnetic layer having a magnetic domain that can be changed or programmed via a write current. In a particular embodiment, the fixed magnetic layer of the MTJ stack 908 may include one or more layers. The MTJ stack 908 includes a first sidewall 934 to carry a first magnetic domain 944 in a first portion of the free layer, a second sidewall 936 to carry a second magnetic domain 946 in a second portion of the free layer, and a third sidewall 938 to carry a third magnetic domain 948 in a third portion of the free layer. The first, second and third magnetic domains 944, 946, and 948 are independent and adapted to store data values. In a particular embodiment, the first magnetic domain 944 is adapted to represent a first bit value, the second magnetic domain 946 is adapted to represent a second bit value, and the third magnetic domain 948 is adapted to represent a third bit value. In general, the orientation of the magnetic domains 944, 946, and 948 is determined by the stored data value. For example, a "0" value is represented by a first orientation while a "1" value is represented by a second orientation. In a particular embodiment, a "0" value and a "1" value may be represented by a parallel or anti-parallel orientation with the fixed layer, respectively.

Figure 10:
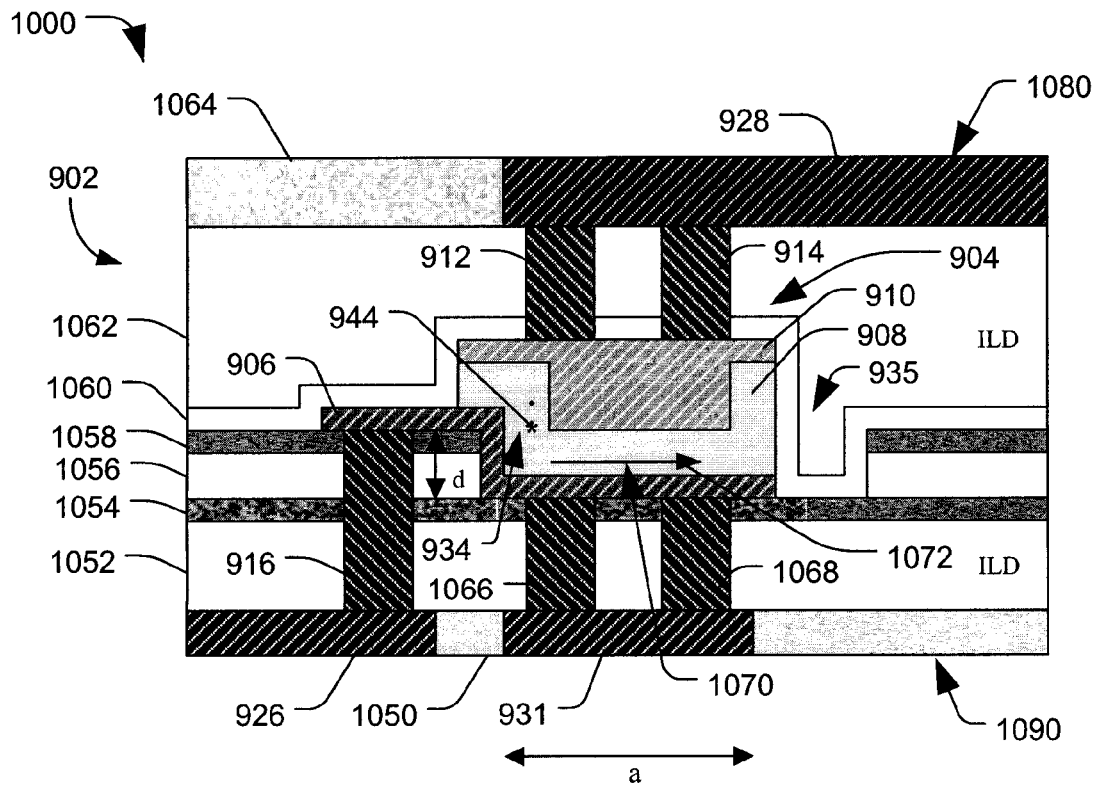
FIG. 10 is a cross-sectional view of the third embodiment of the memory device of FIG. 9 taken along line 10-10 in FIG. 9.

FIG. 10 is a cross-sectional diagram 1000 of the circuit device 900 of FIG. 9 taken along line 10-10 in FIG. 9. The diagram 1000 includes the substrate 902 having a first inter-layer dielectric layer 1050, a second inter-layer dielectric layer 1052, a first cap layer 1054, a third inter-layer dielectric layer 1056, a second cap layer 1058, a third cap layer 1060, a fourth inter-layer dielectric layer 1062, and a fifth inter-layer dielectric layer 1064. The substrate 902 has a first surface 1080 and a second surface 1090. The substrate 902 also includes the MTJ structure 904 including the MTJ stack 908. The bottom electrode 906 and the MTJ stack 908 are disposed within a trench in the substrate 902. The trench has a depth (d).

The substrate 902 includes the first wire trace 926 disposed and patterned at the second surface 1090. The first wire trace 926 is coupled to the first lateral via 916, which extends from the first wire trace 926 to a portion of the bottom electrode 906. The substrate 902 also includes the second wire trace 928 disposed and patterned at the first surface 1080. The second wire trace 928 is coupled to the first center via 912 and 914, which extend from the second wire trace 928 to the center electrode 910. The center electrode 910 is coupled to the MTJ stack 908. The substrate 902 also includes the fifth wire trace 931 at the second surface 1090. The fifth wire trace 931 is coupled to bottom vias 1066 and 1068, which extend from the fifth wire trace 931 to the bottom electrode 906 adjacent to the bottom wall 1070. The substrate 902 also includes the process opening 935, which may be formed by selectively removing a portion of the MTJ structure 904 and by depositing a cap layer and an inter-layer dielectric material within the processing opening 935.

In a particular embodiment, the MTJ stack 908 includes the first sidewall 934, which carries the first magnetic domain 944 in the first portion of the free layer. The first magnetic domain 944 is adapted to represent the first bit value. The MTJ stack 908 also includes a bottom wall 1070 having a bottom magnetic domain 1072 in a bottom portion of the free layer, which is adapted to represent a fourth bit value. In a particular example, a data value can be read from the MTJ stack 908 by applying a voltage to the second wire trace 928 and by comparing a current at the first wire trace 926 and/or the fifth wire trace 931 to a reference current. Alternatively, a bit value may be written to the MTJ stack 908 by applying a write current between the first, second and fifth wire traces 926, 928, and 931. In a particular embodiment, the length (a) and the width (b) of the MTJ stack 908 illustrated in FIG. 9 are greater than the trench depth (d), and the magnetic domain 944 carried by the first sidewall 934 extends in a direction that is substantially parallel to the first surface 1080 of the substrate 902 and in a direction of the width (b) illustrated in FIG. 9. In the particular view of FIG. 10, the magnetic domain 944 extends normal to the page view (outward from the page as indicated by an arrow head ("•") or into the page as indicated by a tail of an arrow ("*")).

Figure 11:
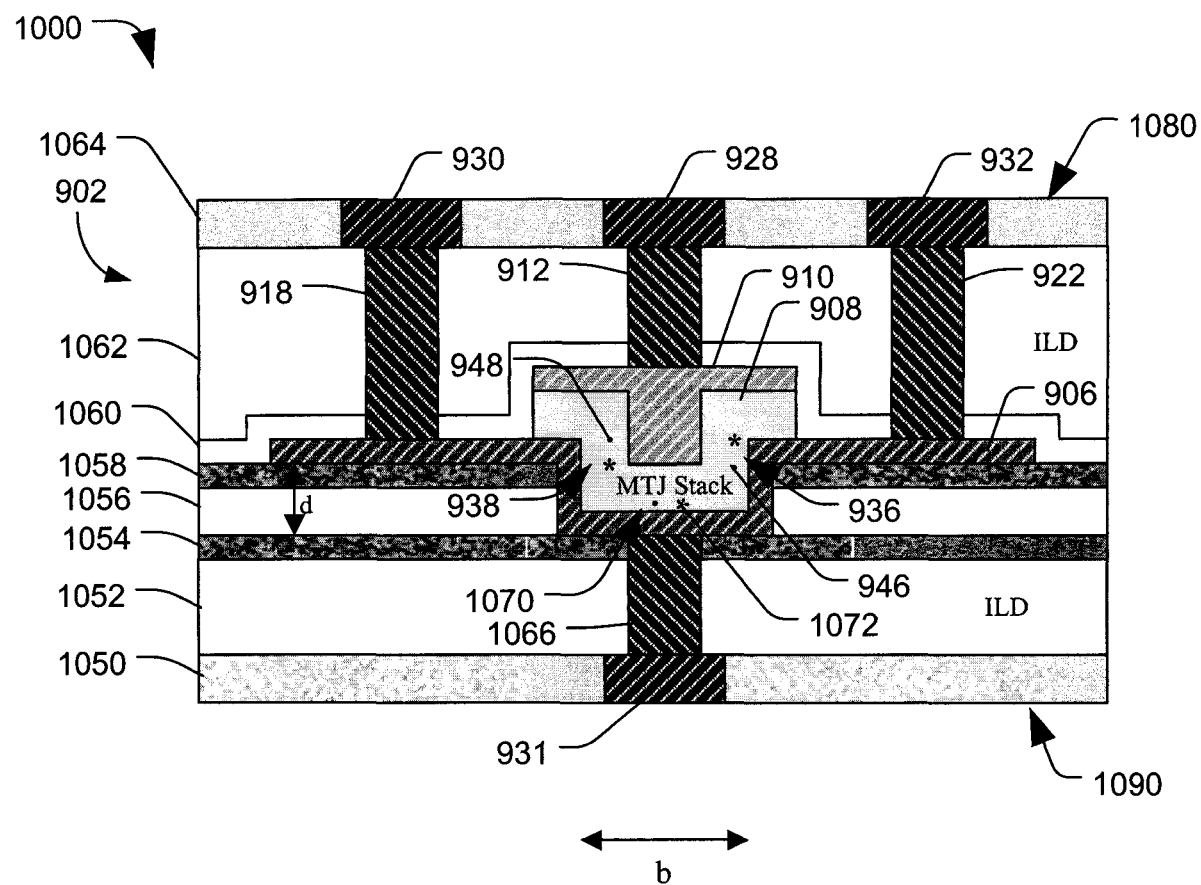
FIG. 11 is a cross-sectional view of the third embodiment of the memory device of FIG. 9 taken along line 11-11 in FIG. 9.

FIG. 11 is a cross-sectional diagram 1100 of the circuit device 900 of FIG. 9 taken along line 11-11 in FIG. 9. The diagram 1100 includes the substrate 902 having a first inter-layer dielectric layer 1050, a second inter-layer dielectric layer 1052, a first cap layer 1054, a third inter-layer dielectric layer 1056, a second cap layer 1058, a third cap layer 1060, a fourth inter-layer dielectric layer 1062, and a fifth inter-layer dielectric layer 1064. The substrate 902 has a first surface 1080 and a second surface 1090. The substrate 902 includes the MTJ structure 904 having the bottom electrode 906, the MTJ stack 908, and the center electrode 910. The substrate 902 includes the third wire trace 930, the second wire trace 928, and the fourth wire trace 932 at the first surface 1080. The third wire trace 930 is coupled to the second lateral via 918, which extends from the third wire trace 930 to a first portion of the bottom electrode 906. The second wire trace 928 is coupled to the center via 912, which extends from the second wire trace 928 to the center electrode 910. The fourth wire trace is coupled to the fourth lateral via 922, which extends from the fourth wire trace 932 to a second portion of the bottom electrode 906. The substrate 902 includes the fifth wire trace 931 at the second surface 1090. The fifth wire trace 931 is coupled to the bottom via 1066, which extends from the fifth wire trace 931 to a portion of the bottom electrode 906 that is adjacent to the bottom wall 1070. The MTJ stack 908 includes the second sidewall 936 to carry the second magnetic domain 946 in the second portion of the free layer, the third sidewall 938 to carry the third magnetic domain 948 in the third portion of the free layer, and the bottom wall 1070 to carry the bottom magnetic domain 1072 in the bottom portion of the free layer.

In a particular embodiment, the MTJ stack 908 is adapted to store up to four unique bit values. A first bit value may be represented by the first magnetic domain 944 in the first portion of the free layer, a second bit value may be represented by the second magnetic domain 946 in the second portion of the free layer, a third bit value may be represented by the third magnetic domain 948 in the third portion of the free layer, and a fourth bit value may be represented by the bottom magnetic domain 1072 in the bottom portion of the free layer. In another particular embodiment, a fourth sidewall may be included to carry a fourth magnetic domain, which may represent a fifth bit value.

Figure 12:
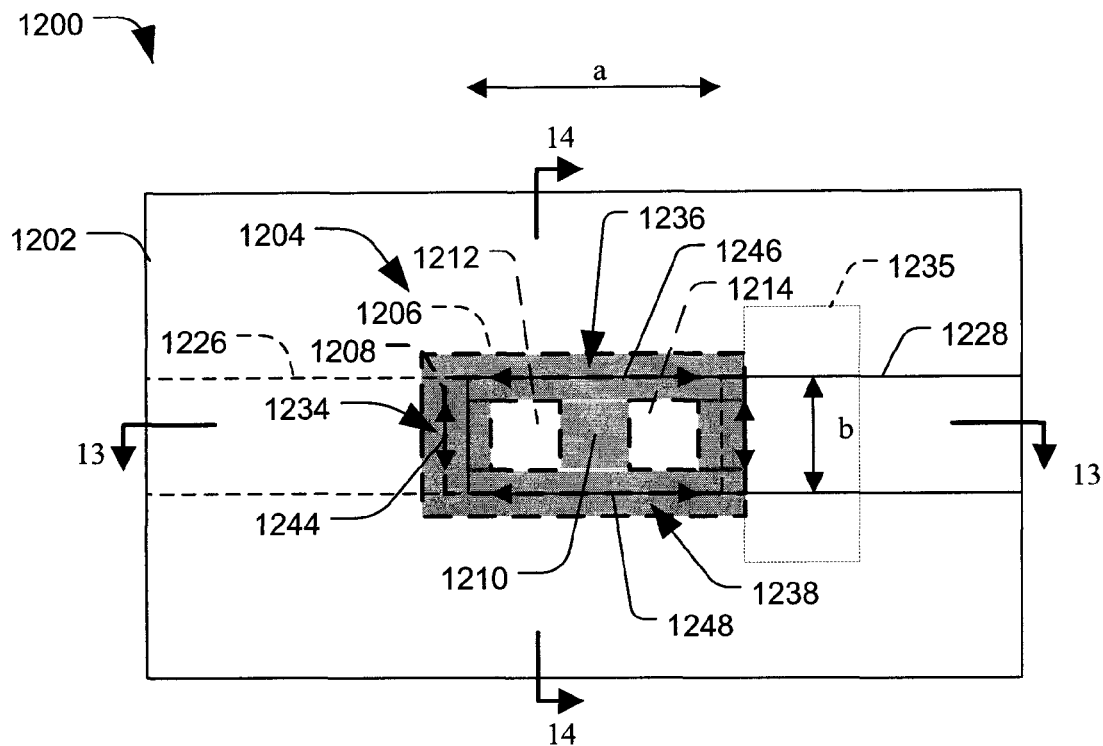
FIG. 12 is a top view of a fourth particular illustrative embodiment of a memory device including a magnetic tunnel junction (MTJ) cell that is adapted to store multiple bits.

FIG. 12 is a top view of a particular illustrative embodiment of a memory device 1200 including a substrate 1202 with having a magnetic tunnel junction (MTJ) cell 1204 that is adapted to store multiple data bits. The substrate 1202 includes a magnetic tunnel junction (MTJ) structure 1204 that has a bottom electrode 1206, an MTJ stack 1208, and a center electrode 1210. The MTJ structure 1204 has a length (a) and a width (b), where the length (a) is greater than the width (b). The substrate 1202 includes a first center via 1212 and a second center via 1214 that are coupled to the center electrode 1210. The substrate 1202 also includes a first wire trace 1226 and a second wire trace 1228. The second wire trace 1228 is coupled to the first and second center vias 1212 and 1214. The substrate 1202 also includes a process opening 1235 to remove a portion of MTJ sidewall.

The MTJ stack 1208 includes a fixed magnetic layer that may be fixed by an anti-ferromagnetic (AF) layer (not shown) and that carries a fixed magnetic domain having a fixed orientation, a tunnel barrier layer, and a free magnetic layer having a magnetic domain that can be changed or programmed via a write current. In a particular embodiment, the fixed magnetic layer of the MTJ stack 1208 may include one or more layers. The MTJ stack 1208 includes a first sidewall 1234 to carry a first magnetic domain 1244 in a first portion of the free layer, a second sidewall 1236 to carry a second magnetic domain 1246 in a second portion of the free layer, and a third sidewall 1238 to carry a third magnetic domain 1248 in a third portion of the free layer. The first, second and third magnetic domains 1244, 1246, and 1248 are independent and adapted to store data values. In a particular embodiment, the first magnetic domain 1244 is adapted to represent a first bit value, the second magnetic domain 1246 is adapted to represent a second bit value, and the third magnetic domain 1248 is adapted to represent a third bit value.

Figure 13:
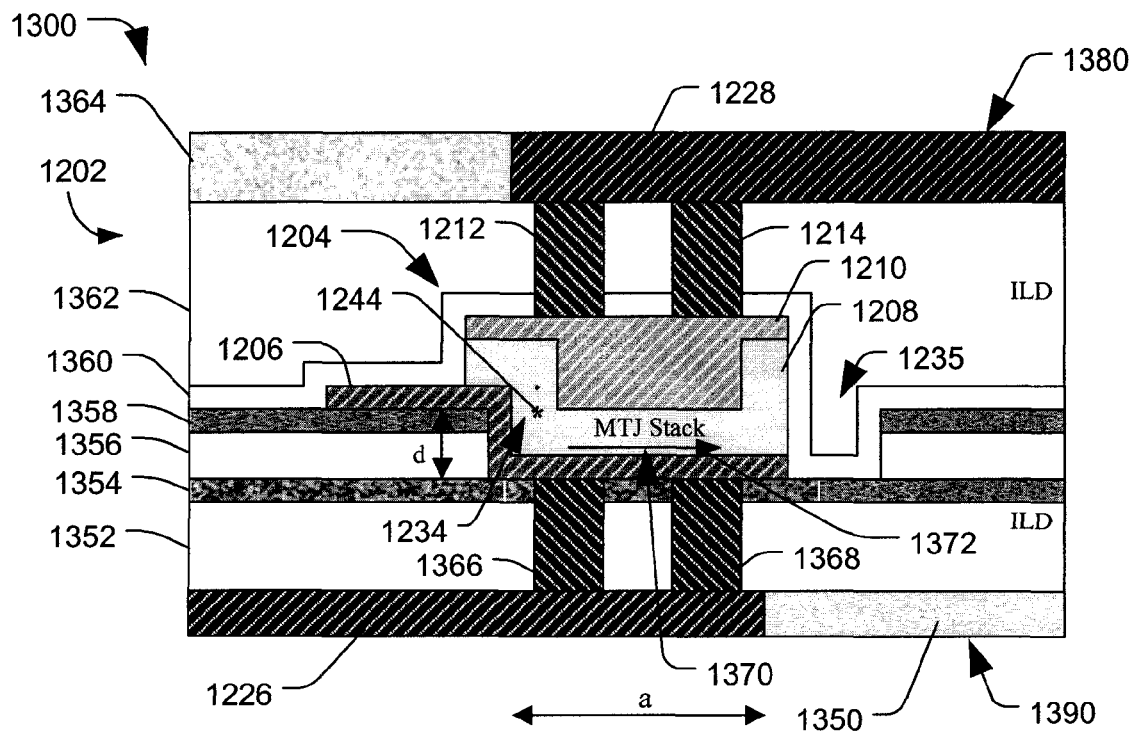
FIG. 13 is a cross-sectional view of the fourth embodiment of the memory device of FIG. 12 taken along line 13-13 in FIG. 12.

FIG. 13 is a cross-sectional diagram 1300 of the circuit device 1200 of FIG. 12 taken along line 13-13 in FIG. 12. The diagram 1300 includes the substrate 1202 having a first inter-layer dielectric layer 1350, a second inter-layer dielectric layer 1352, a first cap layer 1354, a third inter-layer dielectric layer 1356, a second cap layer 1358, a third cap layer 1360, a fourth inter-layer dielectric layer 1362, and a fifth inter-layer dielectric layer 1364. The substrate 1202 has a first surface 1380 and a second surface 1390. The substrate 1202 also includes the MTJ structure 1204 including the MTJ stack 1208. The bottom electrode 1206 and the MTJ stack 1208 are disposed within a trench in the substrate 1202. The trench has a depth (d). The MTJ stack 1208 includes the first sidewall 1234 to carry the first magnetic domain 1244 in the first portion of the free layer and the bottom wall 1370 to carry a bottom magnetic domain 1372 in a bottom portion of the free layer.

The substrate 1202 includes the first wire trace 1226 disposed at the second surface 1390. The first wire trace 1226 is coupled to bottom vias 1366 and 1368, which extend from the first wire trace 1226 to a portion of the bottom electrode 1206 that is adjacent to the bottom wall 1370. The substrate 1202 also includes the second wire trace 1228 at the first surface 1380. The second wire trace 1228 is coupled to the first center via 1212 and 1214, which extend from the second wire trace 1228 to the center electrode 1210. The center electrode 1210 is coupled to the MTJ stack 1208. The substrate 1202 also includes the process opening 1235, which may be formed by selectively removing a portion of the MTJ structure 1204 and by depositing a cap layer and an inter-layer dielectric material within the processing opening 1235.

In a particular embodiment, the MTJ stack 1208 includes the first sidewall 1234, which carries the first magnetic domain 1244 in the first portion of the free layer. The first magnetic domain 1244 is adapted to represent the first bit value. The MTJ stack 1208 also includes a bottom wall 1370 having a bottom magnetic domain 1372 in the bottom portion of the free layer, which is adapted to represent a fourth bit value. In a particular example, a bit value can be read from the MTJ stack 1208 by applying a voltage to the second wire trace 1228 and by comparing a current at the first wire trace 1226 to a reference current. Alternatively, a bit value may be written to the MTJ stack 1208 by applying a write current between the first and second wire traces 1226 and 1228. In a particular embodiment, the length (a) and the width (b) of the MTJ stack 1208 illustrated in FIG. 12 are greater than the trench depth (d), and the magnetic domain 1244 carried by the first sidewall 1234 extends in a direction that is substantially parallel to the first surface 1380 of the substrate 1202 and in a direction of the width (b) illustrated in FIG. 12. In the particular view of FIG. 13, the magnetic domain 1244 extends normal to the page view (outward from the page as indicated by an arrow head ("•") or into the page as indicated by a tail of an arrow ("*")).

Figure 14:
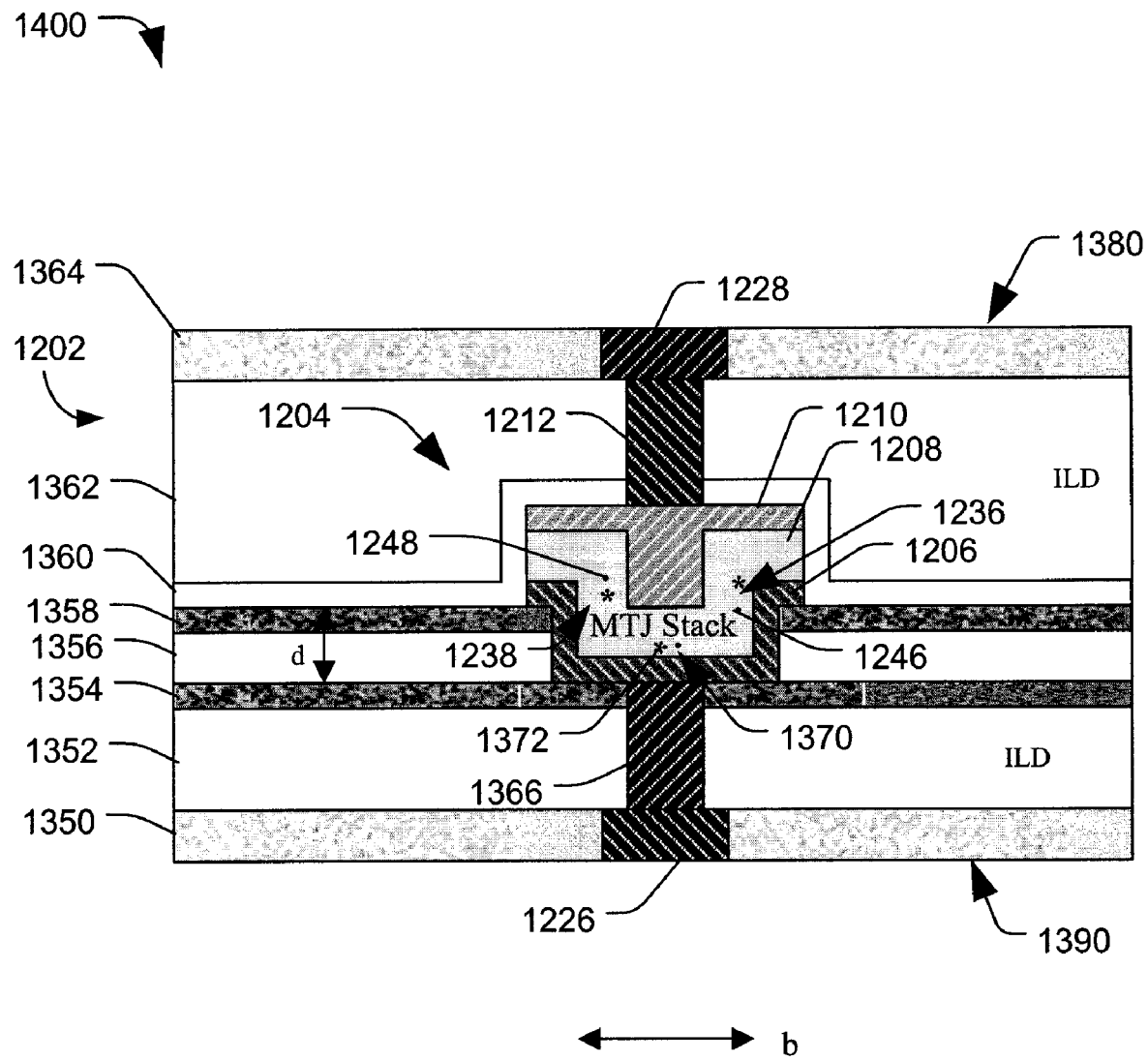
FIG. 14 is a cross-sectional view of the fourth embodiment of the memory device of FIG. 12 taken along line 14-14 in FIG. 12.

FIG. 14 is a cross-sectional diagram 1400 of the circuit device 1200 of FIG. 12 taken along line 14-14 in FIG. 12. The diagram 1400 includes the substrate 1202 having a first inter-layer dielectric layer 1350, a second inter-layer dielectric layer 1352, a first cap layer 1354, a third inter-layer dielectric layer 1356, a second cap layer 1358, a third cap layer 1360, a fourth inter-layer dielectric layer 1362, and a fifth inter-layer dielectric layer 1364. The substrate 1202 has a first surface 1380 and a second surface 1390. The substrate 1202 includes the MTJ structure 1204 having the bottom electrode 1206, the MTJ stack 1208, and the center electrode 1210. The substrate 1202 includes the second wire trace 1228 at the first surface 1380 and includes the first wire trace 1226 at the second surface 1390. The first wire trace 1226 is coupled to the bottom via 1366, which extends from the first wire trace 1226 to a portion of the bottom electrode 1206 that is adjacent to the bottom wall 1370. The second wire trace 1228 is coupled to the center via 1212, which extends from the second wire trace 1228 to the center electrode 1210. The MTJ stack 1208 includes the second sidewall 1236 to carry the second magnetic domain 1246 in the second portion of the free layer, the third sidewall 1238 to carry the third magnetic domain 1248 in the third portion of the free layer, and the bottom wall 1370 to carry the bottom magnetic domain 1372 in the bottom portion of the free layer.

In a particular embodiment, the MTJ stack 1208 is adapted to store up to four unique data values. A first bit value may be represented by the first magnetic domain 1244 in the first portion of the free layer, a second bit value may be represented by the second magnetic domain 1246 in the second portion of the free layer, a third bit value may be represented by the third magnetic domain 1248 in the third portion of the free layer, and a fourth bit value may be represented by the bottom magnetic domain 1372 in the bottom portion of the free layer. In another particular embodiment, a fourth sidewall may be included to carry a fourth magnetic domain, which may represent a fifth bit value. In a particular embodiment, only the fourth bit is accessible via the wire traces 1226 and 1228.

Figure 15:
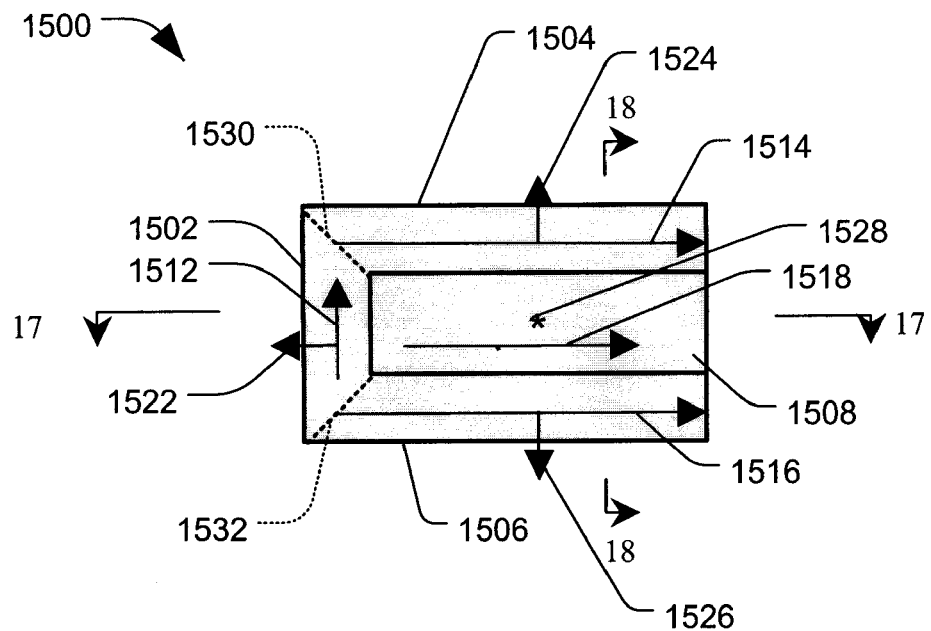
FIG. 15 is a top view of a free layer of a magnetic tunnel junction (MTJ) stack adapted to store multiple data bits where the MTJ cell is in a bit zero state.

FIG. 15 is a top view of a free layer 1500 of a magnetic tunnel junction (MTJ) stack adapted to store multiple data bits. In this example, the free layer 1500 is illustrated in a bit-zero state, where each of the magnetic domains is oriented to represent a zero value. The free layer 1500 includes a first sidewall 1502, a second sidewall 1504, a third sidewall 1506, and a bottom wall 1508. Each of the sidewalls 1502, 1504, and 1506, and the bottom wall 1508 carry a respective magnetic domain configured to represent a bit value, such as a "1" or a "0" value. The first sidewall 1502 carries a first magnetic domain 1512. The second sidewall 1504 carries a second magnetic domain 1514. The third sidewall 1506 carries a third magnetic domain 1516. The bottom wall 1508 carries a fourth magnetic domain 1518.

The first magnetic domain 1512 of the first sidewall 1502 is separated from the second magnetic domain 1514 of the second sidewall 1504 by a first domain barrier 1530. Similarly, the first magnetic domain 1512 of the first sidewall 1502 is separated from the third magnetic domain 1516 of the third sidewall 1506 by a second domain barrier 1532. In general, the first domain barrier 1530 and the second domain barrier 1532 represent domain walls, which are interfaces that separate magnetic domains, such as the magnetic domains 1512, 1514, 1516, and 1518, respectively. Such domain barriers 1530 and 1532 represent a transition between different magnetic moments. In a particular embodiment, the first and second domain barriers 1530 and 1532 may represent a change in a magnetic moment where a magnetic field undergoes an angular displacement of approximately 90 or 270 degrees.

The direction of a magnetic field associated with the first magnetic domain 1512 (i.e., a direction of a magnetic field within a free layer) at the first sidewall 1502 may be altered using a first write current 1522. Similarly, a direction of a magnetic field associated with the second magnetic domain 1514 carried by the sidewall 1504 may be altered using a second write current 1524. A direction of a magnetic field associated with the third magnetic domain 1516 that is carried by the third sidewall 1506 may be altered using a third write current 1526. A direction of a magnetic field associated with the fourth magnetic domain 1518 carried by the bottom wall 1508 may be altered using a fourth write current 1528.

In general, a relative direction of the magnetic field carried by the free layer 1500 relative to a fixed magnetic field associated with a fixed layer of the magnetic tunnel junction (MTJ) stack determines the bit value stored by that particular sidewall 1502, 1504, or 1506 or by the bottom wall 1508. In the example shown, the magnetic orientation of the magnetic domain associated with the fixed layer and the free layer orientations of the magnetic domains 1512, 1514, 1516, and 1518 are in parallel (as illustrated by magnetic fields 1614 and 1616 in FIG. 16). Accordingly, each of the write currents 1522, 1524, 1526 and 1528 represent write "0" currents, placing the MTJ stack in a bit "0" state.

Figure 16:
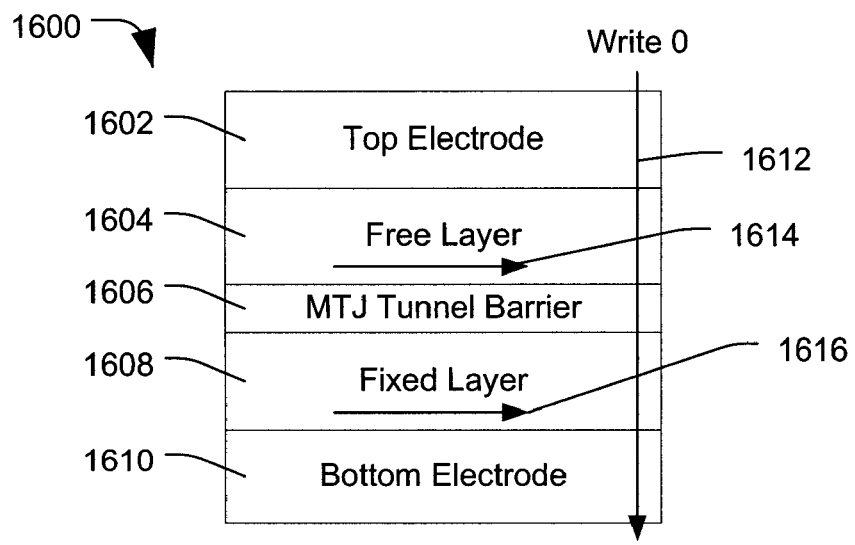
FIG. 16 is a diagram of a particular illustrative embodiment of layers of a magnetic tunnel junction (MTJ) stack illustrating a write zero current flow direction.

FIG. 16 is a block diagram of a magnetic tunnel junction structure 1600. The MTJ structure 1600 includes a top electrode 1602, a free layer 1604, a magnetic tunnel junction tunnel barrier 1606, a fixed layer 1608, an anti-ferromagnetic (AF) layer (not shown), and a bottom electrode 1610. In general, the top electrode 1602 and the bottom electrode 1610 are electrically conductive layers adapted to carry an electrical current. The fixed layer 1608 is a ferromagnetic layer that has been annealed to be pinned by the AF layer to fix a direction of a magnetic field 1616 within the fixed layer 1608. The free layer 1604 is a ferromagnetic layer that has a magnetic field with an orientation that can be changed by a write current. The MTJ tunnel barrier or barrier layer 1606 may be formed from an oxide (such as MgO, $Al_2O_3$, as illustrative examples) or other diamagnetic material. The direction of a magnetic field 1614 within the free layer 1604 may be changed using the write current.

A direction of the magnetic fields in the free layer 1604 relative to the fixed magnetic field of the fixed layer 1608 indicates whether the bit stored at the free layer 1604 of the particular MTJ cell 1600 is a bit value of "1" or bit value of "0." The magnetic direction of the magnetic field in the free layer 1604, generally indicated at 1614, may be changed using a write current 1612. As shown, the write current represent a write 0 current that flows from the top electrode 1602 through the free layer 1604 across the magnetic tunnel junction barrier 1606 through the fixed layer 1608 and through the bottom electrode 1610.

Figure 17:
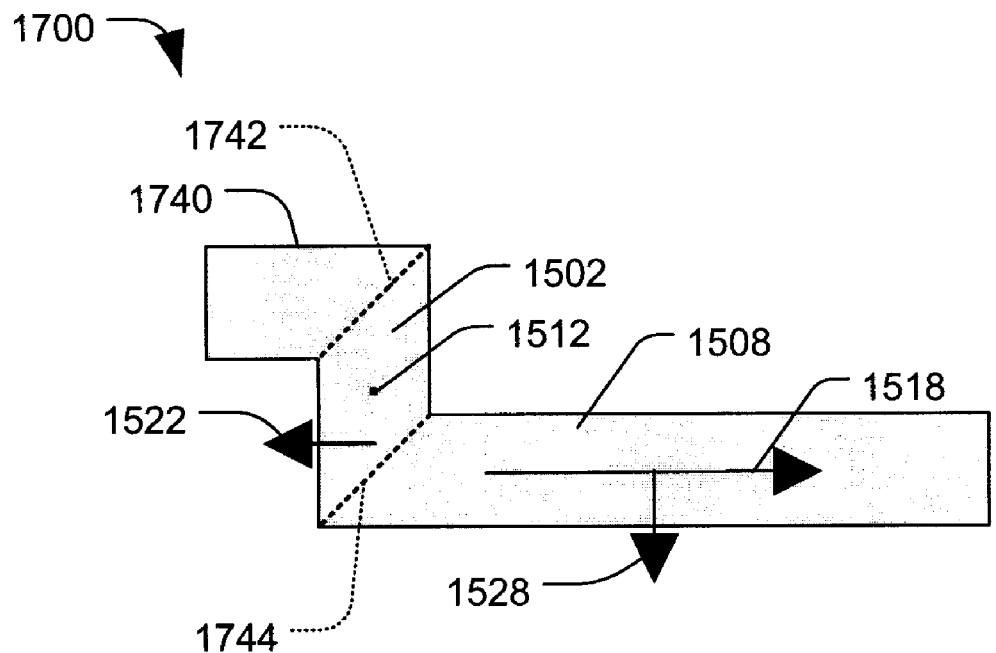
FIG. 17 is a cross-sectional view of the free layer of FIG. 15 taken along line 17-17 in FIG. 15.

FIG. 17 is a cross-sectional view 1700 of the free layer 1500 of the MTJ stack taken along line 17-17 in FIG. 15. The free layer 1500 includes the first sidewall 1502 and the bottom wall 1508. In this example, a direction of a first magnetic field carried by the magnetic domain 1512 at the first sidewall 1502 extends at an angle that is normal to the page and in a direction corresponding to the arrow 1512 illustrated in FIG. 15. The fourth magnetic domain 1518 associated with the bottom wall 1508 extends in a direction that is substantially parallel to a surface of the substrate.

The free layer 1500 includes a first portion 1740, a first domain barrier (wall) 1742 and a second domain barrier 1744.

In a particular example, the first domain barrier 1742 separates the first magnetic domain 1512 from the first portion 1740 and the second domain barrier 1744 separates the first magnetic domain 1512 from the fourth magnetic domain 1518 associated with the bottom wall 1508. In a particular embodiment, the first and second domain barriers 1742 and 1744 may correspond to structural interfaces between the first sidewall 1502 and the first portion 1740 and between the first sidewall 1502 and the bottom wall 1508, respectively. The first magnetic domain 1512 may be configured using the write current 1522. The fourth magnetic domain 1518 may be configured using the write current 1528. In a particular embodiment, the first and fourth magnetic domains 1512 and 1518 may represent unique bit values.

Figure 18:
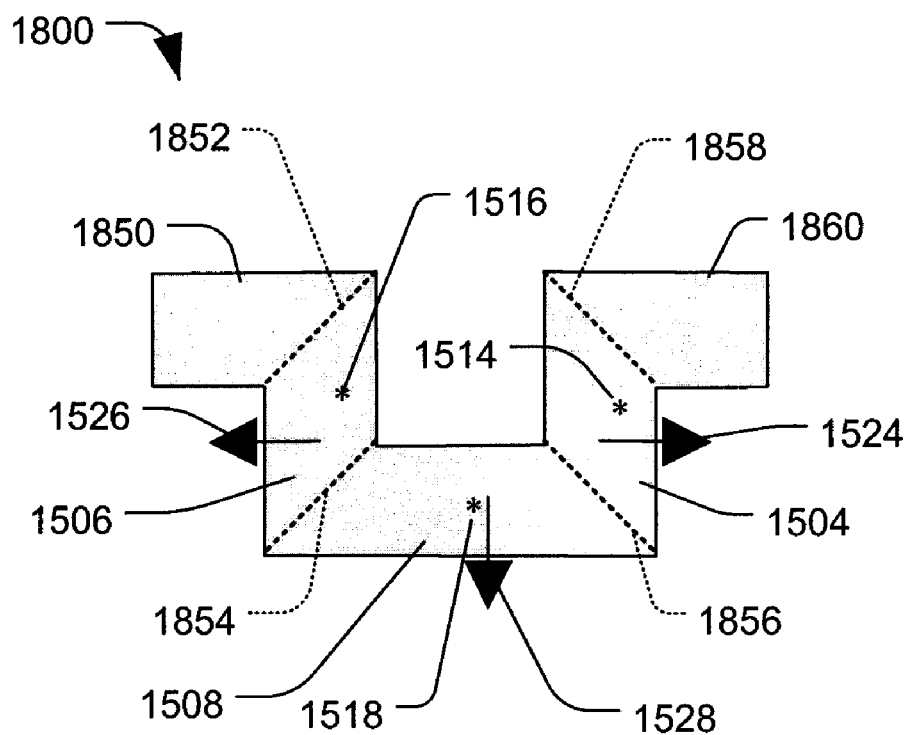
FIG. 18 is a cross-sectional view of the free layer of FIG. 15 taken along line 18-18 in FIG. 15.

FIG. 18 is a diagram of a cross-sectional view 1800 of the free layer 1500 of the MTJ stack taken along lines 18-18 in FIG. 15. The free layer 1500 includes the second and third sidewalls 1504 and 1506 and the bottom wall 1508. In this particular example, the free layer 1500 includes a second portion 1850, a third magnetic domain barrier 1852, a fourth magnetic domain barrier 1854, a fifth magnetic domain barrier 1856, a sixth magnetic domain barrier 1858, and a third portion 1860. The second and third magnetic domain barriers (or walls) 1852 and 1854 isolate the second magnetic domain 1516 carried by the second sidewall 1506 from the second portion 1850 and from the fourth magnetic domain 1518 carried by the bottom wall 1508 isolate the third sidewall 1504 from the third portion 1860 and from the fourth magnetic domain 1518 associated with the bottom wall 1508. In a particular embodiment, the second, fourth, and fifth magnetic domain barriers 1744, 1854, and 1856 may correspond to respective structural interfaces between the sidewalls 1502, 1504, and 1506 and the bottom wall 1508.

In a particular illustrative embodiment, the free layer 1500 illustrated in FIGS. 15, 17, and 18 is a portion of a magnetic tunnel junction (MTJ) stack that is adapted to store up to four bits, which may be represented by the magnetic fields 1512, 1514, 1516, and 1518.

Figure 19:
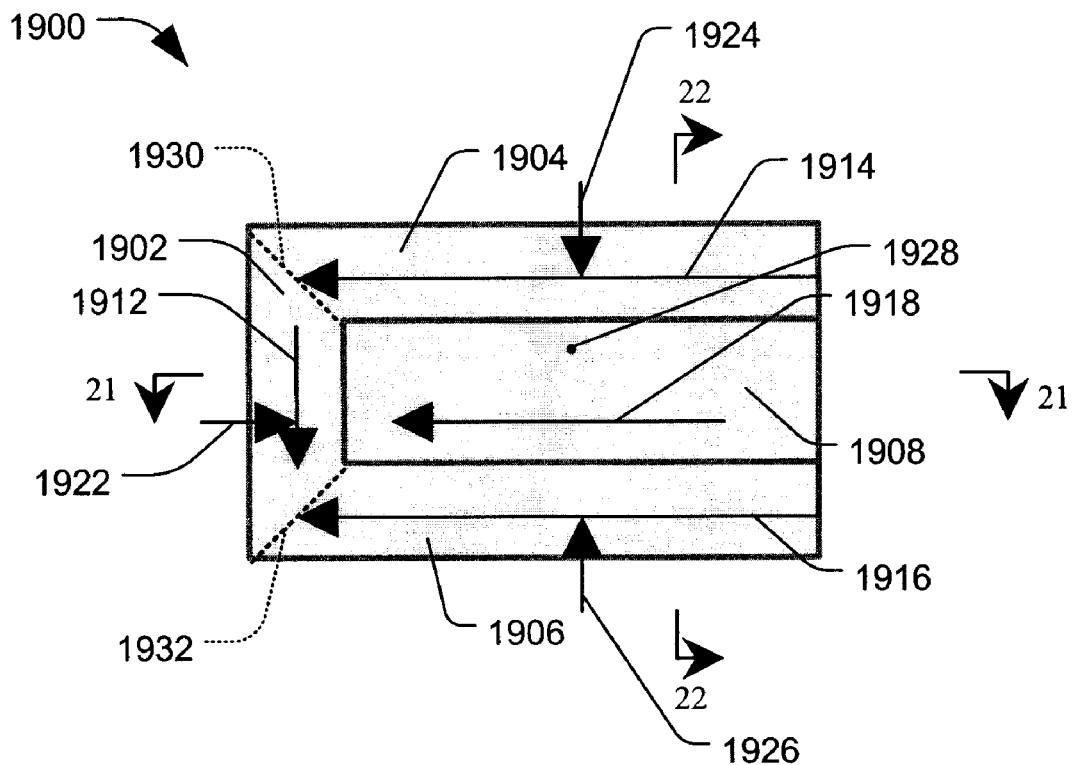
FIG. 19 is a top view of a free layer of a magnetic tunnel junction (MTJ) stack adapted to store multiple data bits where the MTJ stack is in a bit one state.

FIG. 19 is a top view of a free layer 1900 of a magnetic tunnel junction (MTJ) stack adapted to store multiple bits. In this example, the free layer 1900 is illustrated in a bit "1" state, where each of the magnetic domains is oriented to represent a logic high or bit "1" value. The free layer 1900 includes a first sidewall 1902, a second sidewall 1904, a third sidewall 1906, and a bottom wall 1908. Each of the sidewalls 1902, 1904, and 1906, and the bottom wall 1908 carry a respective magnetic domain in corresponding portions of the free layer that is configured to represent a bit value, such as a "1" or a "0" value. The first sidewall 1902 carries a first magnetic domain 1912 in a first portion of the free layer. The second sidewall 1904 carries a second magnetic domain 1914 in a second portion of the free layer. The third sidewall 1906 carries a third magnetic domain 1916 in a third portion of the free layer. The bottom wall 1908 carries a fourth magnetic domain 1918 in a bottom portion of the free layer.

The first magnetic domain 1912 of the first sidewall 1902 is separated from the second magnetic domain 1914 of the second sidewall 1904 by a first domain barrier 1930. Similarly, the first magnetic domain 1912 of the first sidewall 1902 is separated from the third magnetic domain 1916 of the third sidewall 1906 by a second domain barrier 1932. In general, the first domain barrier 1930 and the second domain barrier 1932 represent domain walls, which are interfaces that separate magnetic domains, such as the magnetic domains 1912, 1914, 1916, and 1918, respectively. Such domain barriers 1930 and 1932 represent a transition between different magnetic moments. In a particular embodiment, the first and second domain barriers 1930 and 1932 may represent a change in a magnetic moment where a magnetic field undergoes an angular displacement of approximately 90 or 270 degrees.

The direction of a magnetic field associated with the first magnetic domain 1912 (i.e., a direction of a magnetic field within a free layer) at the first sidewall 1902 may be altered using a first write current 1922. Similarly, a direction of a magnetic field associated with the second magnetic domain 1914 carried by the sidewall 1904 may be altered using a second write current 1924. A direction of a magnetic field associated with the third magnetic domain 1916 that is carried by the third sidewall 1906 may be altered using a third write current 1926. A direction of a magnetic field associated with the fourth magnetic domain 1918 carried by the bottom wall 1908 may be altered using a fourth write current 1928.

In general, a relative direction of the magnetic field carried by the free layer 1900 relative to a fixed magnetic field associated with a fixed layer of the magnetic tunnel junction (MTJ) stack determines the bit value stored by that particular sidewall 1902, 1904, or 1906 or by the bottom wall 1908. In the example shown, the magnetic orientation of the magnetic domain associated with the fixed layer and the orientations of the free layer magnetic domains 1912, 1914, 1916, and 1918 are in anti-parallel (as illustrated by magnetic fields 2014 and 2016 in FIG. 20). Accordingly, each of the write currents 1922, 1924, 1926 and 1928 represent write "1" currents, placing the MTJ stack in a logic high or bit "1" state.

Figure 20:
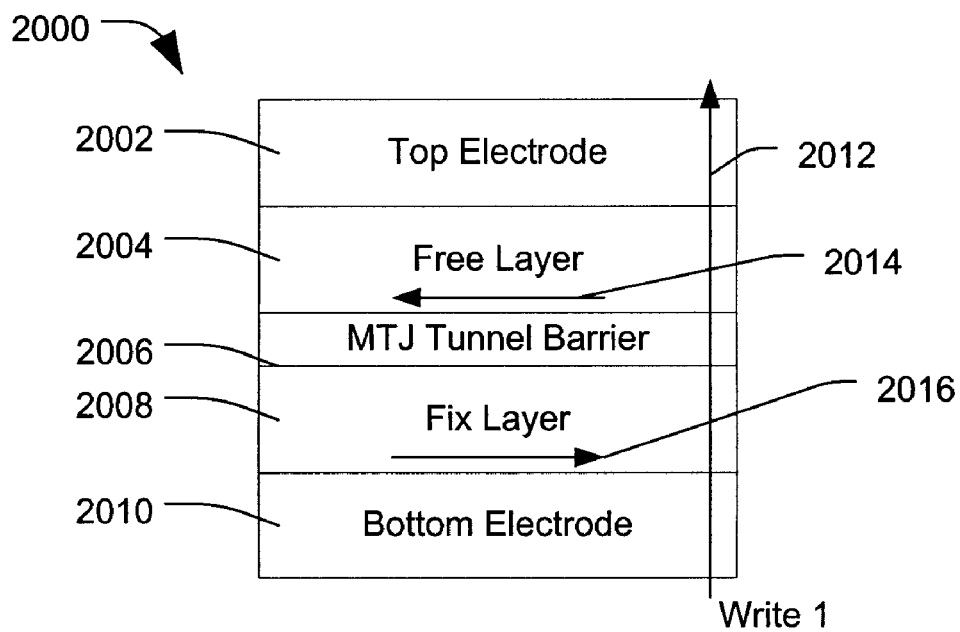
FIG. 20 is a diagram of a particular illustrative embodiment of layers of a magnetic tunnel junction (MTJ) structure illustrating a write one current flow direction.

FIG. 20 is a block diagram of a magnetic tunnel junction structure 2000. The MTJ structure 2000 includes a top electrode 2002, a free layer 2004, a magnetic tunnel junction tunnel barrier 2006, a fixed layer 2008, and a bottom electrode 2010. In general, the top electrode 2002 and the bottom electrode 2010 are electrically conductive layers adapted to carry an electrical current. The fixed layer 2008 is a ferromagnetic layer that has been annealed to fix a direction of a magnetic field 2016 within the fixed layer 2008. The free layer 2004 is a ferromagnetic layer that has not been annealed. The MTJ tunnel barrier or barrier layer 2006 may be formed from an oxide or other anti-ferromagnetic material. The direction of a magnetic field 2014 within the free layer 2004 may be changed using the write current.

A direction of the magnetic fields in the free layer 2004 relative to the fixed magnetic field of the fixed layer 2008 indicates whether the bit stored at the free layer 2004 of the particular MTJ cell 2000 is a bit value of "1" or bit value of "0." The magnetic direction of the magnetic field in the free layer 2004, generally indicated at 2014, may be changed using a write current 2012. As shown, the write current represent a write 1 current that flows from the bottom electrode 2010 through the fixed layer 2008 across the magnetic tunnel junction barrier 2006 through the free layer 2004 and through the top electrode 2002.

Figure 21:
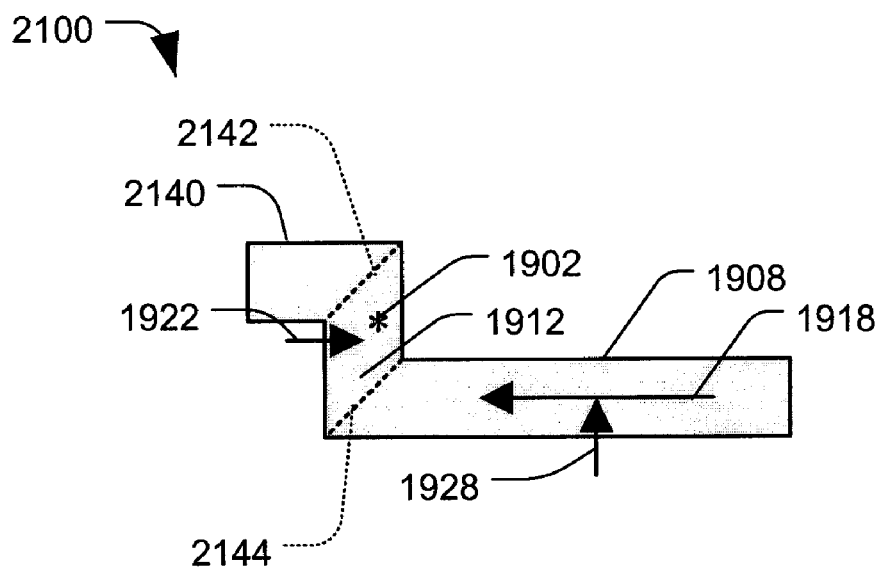
FIG. 21 is a cross-sectional view of the MTJ stack of FIG. 19 taken along line 21-21 in FIG. 19.

FIG. 21 is a cross-sectional view 2100 of the free layer 1900 of the MTJ stack taken along line 21-21 in FIG. 19. The free layer 1900 includes the first sidewall 1902 and the bottom wall 1908. In this example, a direction of a first magnetic field carried by the magnetic domain 1912 at the first sidewall 1902 extends at an angle that is normal to the page and in a direction corresponding to the arrow 1912 illustrated in FIG. 11. The fourth magnetic domain 1918 associated with the bottom wall 1908 extends in a direction that is substantially parallel to a surface of the substrate.

The free layer 1900 includes a first portion 2140, a first domain barrier (wall) 2142 and a second domain barrier 2144. In a particular example, the first domain barrier 2142 separates the first magnetic domain 1912 from the first portion 2140 and the second domain barrier 2144 separates the first magnetic domain 1912 from the fourth magnetic domain 1918 associated with the bottom wall 1908. In a particular embodiment, the first and second domain barriers 2142 and 2144 may correspond to structural interfaces between the first sidewall 1902 and the first portion 2140 and between the first sidewall 1902 and the bottom wall 1908, respectively. The first magnetic domain 1912 may be configured using the write current 1922. The fourth magnetic domain 1918 may be configured using the write current 1928. In a particular embodiment, the first and fourth magnetic domains 1912 and 1918 may represent unique bit values.

Figure 22:
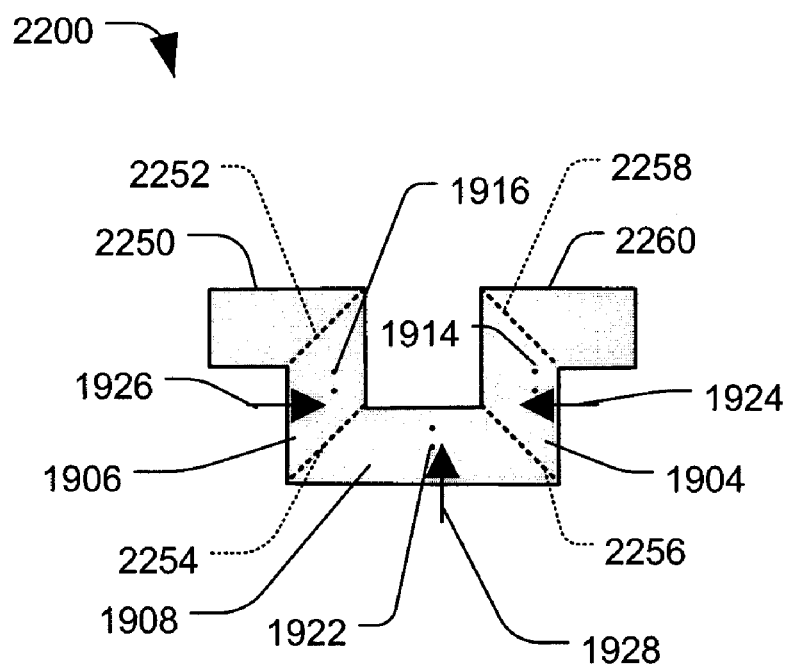
FIG. 22 is a cross-sectional view of the MTJ stack of FIG. 19 taken along line 22-22 in FIG. 19.

FIG. 22 is a diagram of a cross-sectional view 2200 of the free layer 1900 of the MTJ stack taken along lines 22-22 in FIG. 19. The free layer 1900 includes the second and third sidewalls 1904 and 1906 and the bottom wall 1908. In this particular example, the free layer 1900 includes a second portion 2250, a third magnetic domain barrier 2252, a fourth magnetic domain barrier 2254, a fifth magnetic domain barrier 2256, a sixth magnetic domain barrier 2258, and a third portion 2260. The second and third magnetic domain barriers (or walls) 2252 and 2254 isolate the second magnetic domain 1916 carried by the second sidewall 1906 from the second portion 2250 and from the fourth magnetic domain 1918 carried by the bottom wall 1908 isolate the third sidewall 1904 from the third portion 2260 and from the fourth magnetic domain 1918 associated with the bottom wall 1908. In a particular embodiment, the second, fourth, and fifth magnetic domain barriers 2144, 2254, and 2256 may correspond to respective structural interfaces between the sidewalls 1902, 1904, and 1906 and the bottom wall 1908.

In a particular illustrative embodiment, the free layer 1900 illustrated in FIGS. 19, 21, and 22 is a portion of a magnetic tunnel junction (MTJ) stack that is adapted to store up to four bits, which may be represented by the magnetic fields 1912, 1914, 1916, and 1918.

Figure 23:
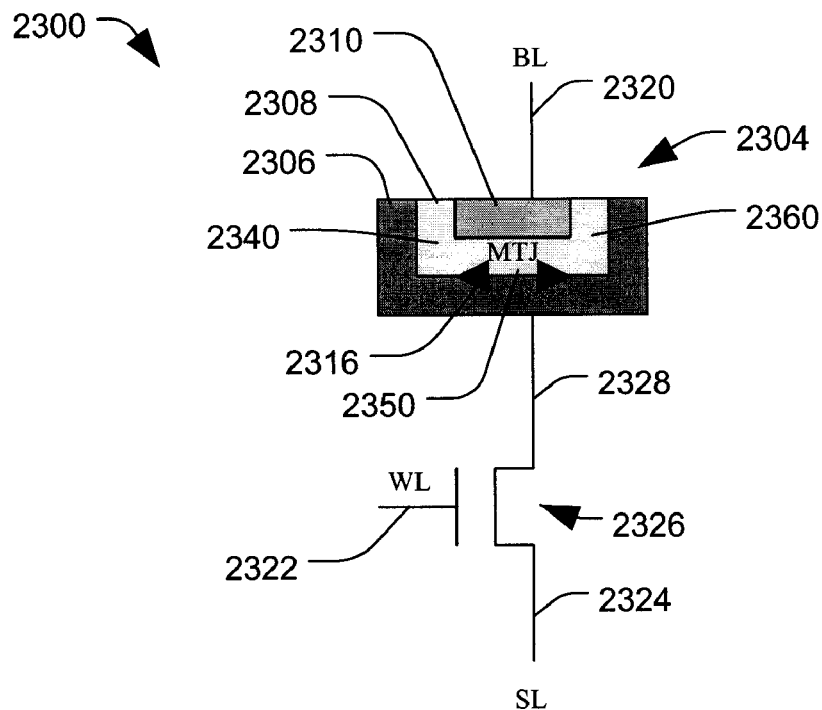
FIG. 23 is a diagram showing a cross-sectional view of an embodiment of an MTJ cell coupled to a bidirectional switch to read data from and to write data to the MTJ cell.

FIG. 23 is a diagram of a magnetic tunnel junction (MTJ) cell 2300 adapted to store a bit. The MTJ cell 2300 may be utilized in a memory array including bit lines, such as a bit line 2320, and including word lines, such as a word line 2322. The MTJ cell 2300 includes an MTJ structure 2304 having a bottom electrode 2306, an MTJ stack 2308, and a center electrode 2310. The MTJ stack 2308 includes a fixed layer, a magnetic tunnel barrier, and a free layer that carries a programmable magnetic domain, which has an orientation that may be altered by applying a write current. The fixed layer may be pinned by an anti-ferromagnetic (AF) layer (not shown). The bit line 2320 is coupled to the center electrode 2310. The word line 2322 is coupled to a control terminal of a switch 2326 that includes a first terminal 2328 coupled to the bottom electrode 2306. In a particular embodiment, the switch 2326 may be a metal oxide semiconductor field effect transistor (MOSFET), a transistor, or other switching circuit component. In another embodiment, the switch 2326 can be a bi-directional switch to allow current flow both into and out of the MTJ structure 2304. The switch 2326 includes the first terminal 2328 coupled to the bottom electrode 2306, a control terminal coupled to the word line 2322, and a second terminal 2324 coupled to a source line (SL), which may be coupled to a power source.

In a particular illustrative embodiment, a signal (or voltage) may be applied to the bit line 2320 and to the word line 2322 to activate the switch 2326. After activating the switch 2326, data may be read from the MTJ cell 2300 based on a current flow through the MTJ cell 2300. For example, a fixed voltage may be applied to the bit line 2320 and a voltage may be applied to the word line 2322 to activate the switch 2326.

A bit value represented by an orientation of bottom magnetic domain 2316 at a bottom wall 2350 of the MTJ stack 2308 may be determined based on a current flow measured either at the bit line 2320 or at the source line coupled to the terminal 2324, for example. In this particular instance, the MTJ cell 2300 may store a single bit value. The MTJ cell 2300 may be a memory cell within a memory array, such as a magneto-resistive random access memory (MRAM), an N-way cache, a non-volatile storage device, other memory devices, or any combination thereof.

Additionally, it should be understood that an additional terminal can be coupled to a sidewall, such as the sidewall 2340 to access an additional magnetic domain associated with the sidewall 2340 for storage and retrieval of an additional bit value. Further, in a particular example, it should be understood that a third sidewall may be provided with an associated switch for storage and retrieval of a third bit.

Figure 24:
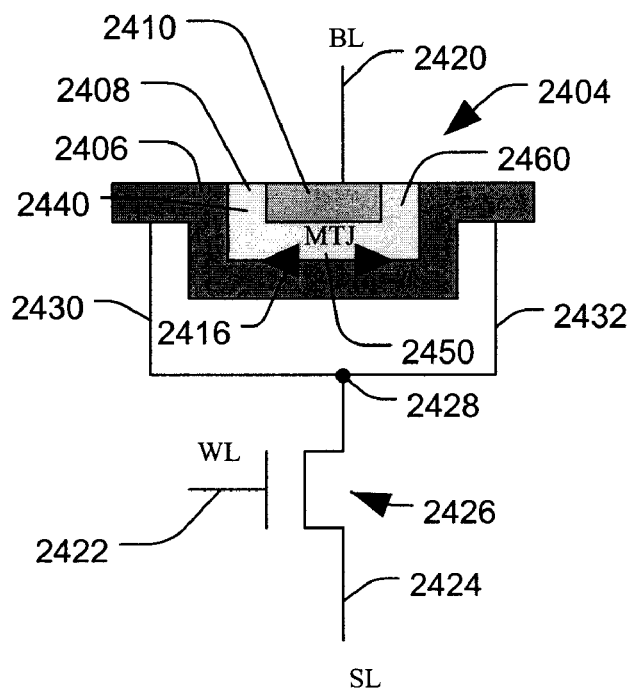
FIG. 24 is a diagram illustrating a cross-sectional view of a second embodiment of an MTJ cell coupled to a bi-directional switch to read data from and to write data to the MTJ cell.

FIG. 24 is a diagram of a magnetic tunnel junction (MTJ) cell 2400 adapted to store multiple data bits. The MTJ cell 2400 includes an MTJ structure 2404 including a bottom electrode 2406, an MTJ stack 2408, and a center electrode 2410. The MTJ stack 2408 includes a fixed magnetic layer, a magnetic tunnel junction barrier layer, and a free magnetic layer. The fixed magnetic layer may be pinned by an anti-ferromagnetic (AF) layer (not shown). The free magnetic layer carries a magnetic domain that can be changed using a write current to store a bit value. The MTJ cell 2400 may be a memory cell within a memory array, such as a magneto-resistive random access memory (MRAM), an N-way cache, a non-volatile storage device, other memory devices, or any combination thereof.

The MTJ stack 2408 includes a first sidewall 2440, a bottom wall 2450, and a second sidewall 2460. A bit line 2420 is coupled to the center electrode 2410. A word line 2422 is coupled to a control terminal of a switch 2426. The switch 2426 includes a first terminal coupled to a node 2428, which is coupled to the first sidewall 2440 and the second sidewall 2460 via lines 2430 and 2432, respectively. The switch also includes a second terminal 2424 that is coupled to a source line (SL), which may be coupled to a first power source.

In a particular example, the switch 2426 may be activated by applying a voltage or current to the word line 2422. Data may be read from the MTJ cell 2400 by activating the switch 2426 and by applying power to the bit line 2420. The MTJ cell 2400 is adapted to represent a single bit value via the first and second sidewalls 2440 and 2460. In another particular embodiment, an additional switch may be coupled to the bottom wall 2450 to access the magnetic domain 2416.

Figure 25:
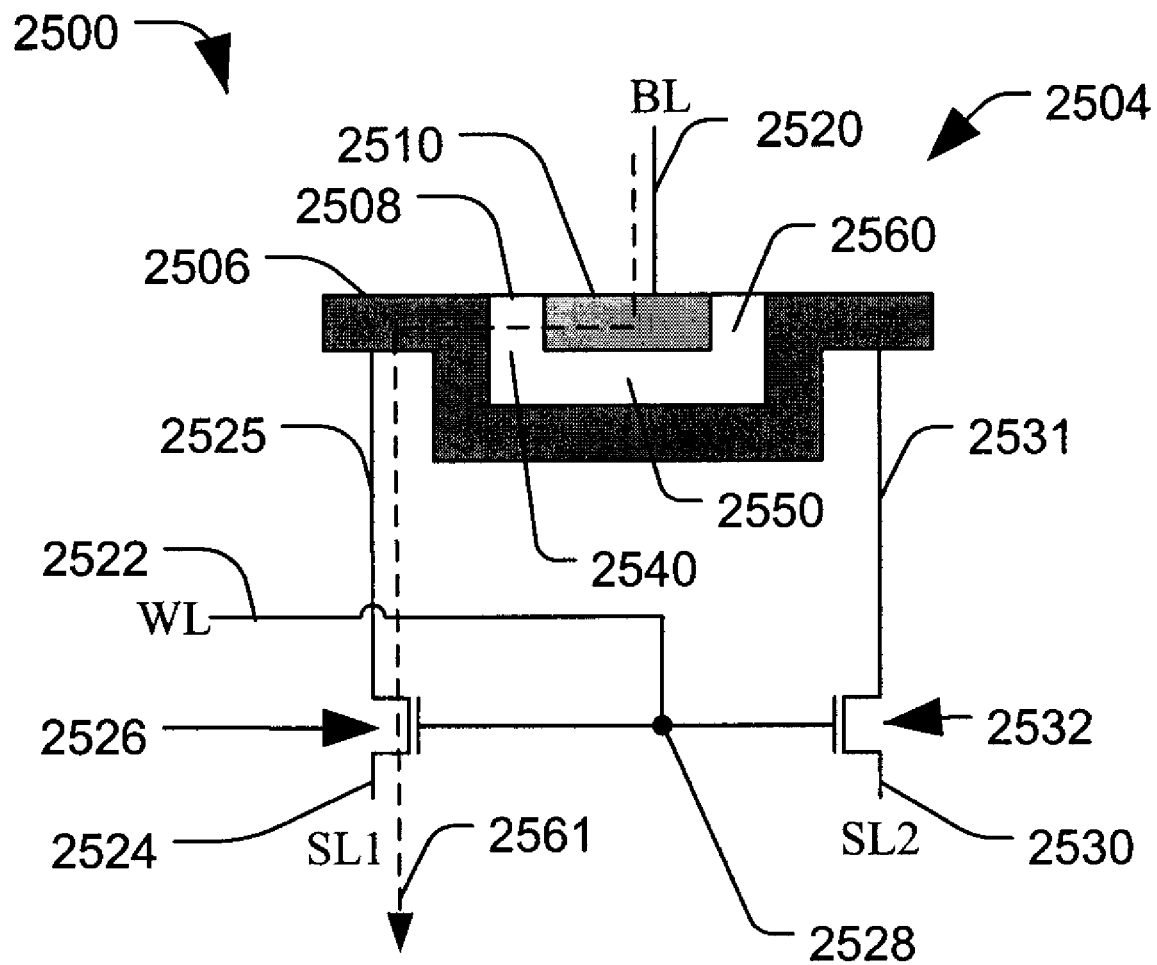
FIG. 25 is a diagram showing a cross-sectional view of a third embodiment of an MTJ cell adapted to store multiple data bits and coupled to multiple switches to read data from and to write data to the MTJ cell.

FIG. 25 is a diagram of a magnetic tunnel junction cell 2500 adapted to store multiple data bits. The MTJ cell 2500 includes an MTJ structure 2504 including a bottom electrode 2506, an MTJ stack 2508, and a center electrode 2510. The MTJ stack 2508 includes a fixed magnetic layer, a magnetic tunnel junction barrier layer, and a free magnetic layer. The fixed magnetic layer may be pinned by an anti-ferromagnetic (AF) layer (not shown). The free magnetic layer carries a magnetic domain that can be changed using a write current to store a bit value. The MTJ cell 2500 may be a memory cell within a memory array, such as a magneto-resistive random access memory (MRAM), an N-way cache, a non-volatile storage device, other memory devices, or any combination thereof.

The MTJ stack 2508 includes a first sidewall 2540, a bottom wall 2550, and a second sidewall 2560. Each of the sidewalls 2540 and 2560 and the bottom wall 2550 carries a respective magnetic domain adapted to represent a bit value. The MTJ stack 2508 is coupled to a bit line 2520 via the top electrode 2510. The first sidewall 2540 of the MTJ stack 2508 is coupled to a first switch 2526 via the bottom electrode 2506. The first switch 2526 includes a first terminal 2525 that is coupled to a first portion of the bottom electrode 2506, a control terminal coupled to a node 2528, and a second terminal 2524 coupled to a first source line (SL1). A word line 2522 is coupled to the node 2528. The second sidewall 2560 of the MTJ stack 2508 is coupled to a second switch 2532 via the bottom electrode 2506. The second switch 2532 includes a third terminal 2531 that is coupled to a second portion of the bottom electrode 2506, a control terminal coupled to the node 2528, and a fourth terminal 2530 coupled to a second source line (SL2).

In a particular example, the first and second switches 2526 and 2532 may be transistors. The first switch 2526 may be activated via the word line 2522 to provide a current path from the bit line 2520 through the center electrode 2510, the MTJ structure 2508, the bottom electrode 2506, the first terminal 2525 and the first switch 2526 to the second terminal 2524, as indicated at 2561. Current flow via the current path 2561 may be compared to a reference current to determine a "1" value or a "0" value represented by a magnetic domain of the first sidewall 2540. Similarly, a current path provided via the terminal 2531 through the switch 2532 may be utilized to access data stored via a magnetic domain at the second sidewall 2560 of the MTJ cell 2500.

In a particular illustrative embodiment, a third electrode may be coupled to the bottom wall 2550 of the MTJ cell 2500 to access a third bit, which may be represented by a magnetic domain associated with the bottom wall 2550. Further, the MTJ cell 2500 may include a fourth terminal coupled to a third sidewall (not shown) to store and retrieve a fourth bit. In this manner, the MTJ cell 2500 may be adapted to store multiple unique bit values.

In general, to utilize multiple magnetic domains to store multiple data values at the sidewalls 2540 and 2560 and at the bottom wall 2550, switches, such as the first and second switches 2526 and 2532, may be used. An advantage of the MTJ cell 2500 is that multiple lateral magnetic domains may be formed to allow multiple bits to be stored within a single cell, thereby increasing storage density.

Figure 26:
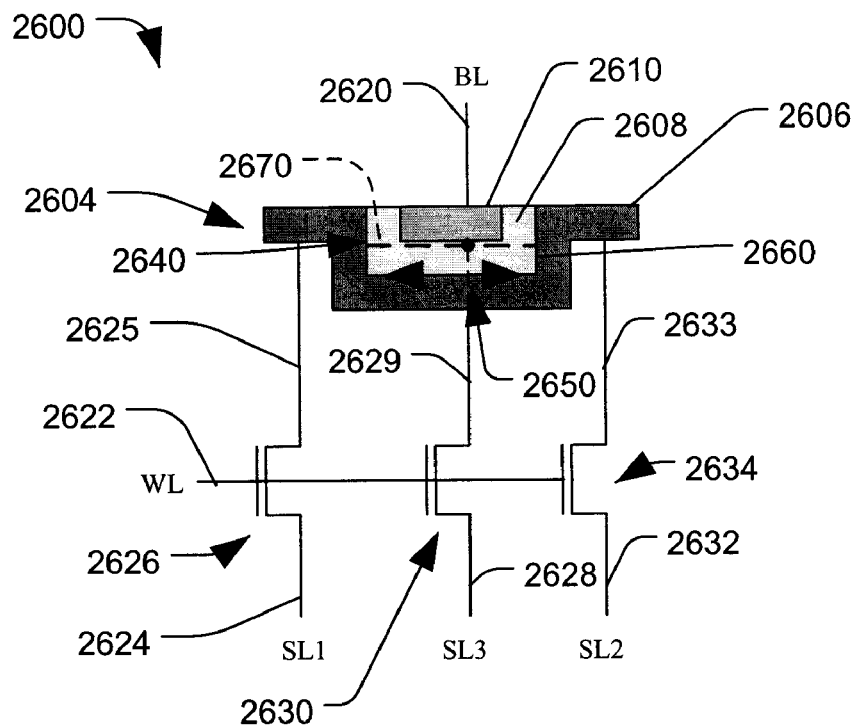
FIG. 26 is a diagram showing a cross-sectional view of a fourth embodiment of an MTJ cell adapted to store multiple data bits and coupled to multiple switches to read data from and to write data to the MTJ cell.

FIG. 26 is a diagram of a magnetic tunnel junction (MTJ) cell 2600 adapted to store multiple bits. The MTJ cell 2600 includes an MTJ structure 2604 including a bottom electrode 2606, an MTJ stack 2608, and a center electrode 2610. The MTJ stack 2608 includes a fixed magnetic layer, a magnetic tunnel junction barrier layer, and a free magnetic layer. The fixed magnetic layer may be pinned by an anti-ferromagnetic (AF) layer (not shown). The free magnetic layer carries a magnetic domain that can be changed using a write current to store a bit value. The MTJ cell 2600 may be a memory cell within a memory array, such as a magneto-resistive random access memory (MRAM), an N-way cache, a non-volatile storage device, other memory devices, or any combination thereof.

The MTJ stack 2608 includes a first sidewall 2640, a bottom wall 2650, a second sidewall 2660, and a third sidewall 2670 (shown in phantom). Each of the sidewalls 2640, 2660, and 2670 and the bottom wall 2650 carries a respective magnetic domain adapted to represent a bit value. The MTJ stack 2608 is coupled to a bit line 2620 via the top electrode 2610. The first sidewall 2640 of the MTJ stack 2608 is coupled to a first switch 2626 via the bottom electrode 2606. The first switch 2626 includes a first terminal 2625 that is coupled to a first portion of the bottom electrode 2606, a control terminal coupled to a word line 2622, and a second terminal 2624 coupled to a first source line (SL1). The second sidewall 2660 is coupled to a second switch 2634 via the bottom electrode 2606. The second switch 2634 includes a third terminal 2633 that is coupled to a second portion of the bottom electrode 2606, a second control terminal coupled to the word line 2622, and a fourth terminal 2632 coupled to a second source line (SL2). The third sidewall 2670 is coupled to a third switch 2630 via the bottom electrode 2606. The third switch 2630 includes a fifth terminal 2629 that is coupled to a third portion of the bottom electrode 2606 adjacent to the third sidewall 2670, a third control terminal coupled to the word line 2622, and a sixth terminal 2628 coupled to a third source line (SL3).

In a particular embodiment, the first, second, and third switches 2626, 2630, and 2634 may be activated to read and/or write data from and to the MTJ cell 2600. In another particular embodiment, the first, second, and third switches 2626, 2630, and 2634 are coupled to respective word lines, which may be selectively activated to read and/or write data from and to the MTJ cell 2600.

Figure 27:
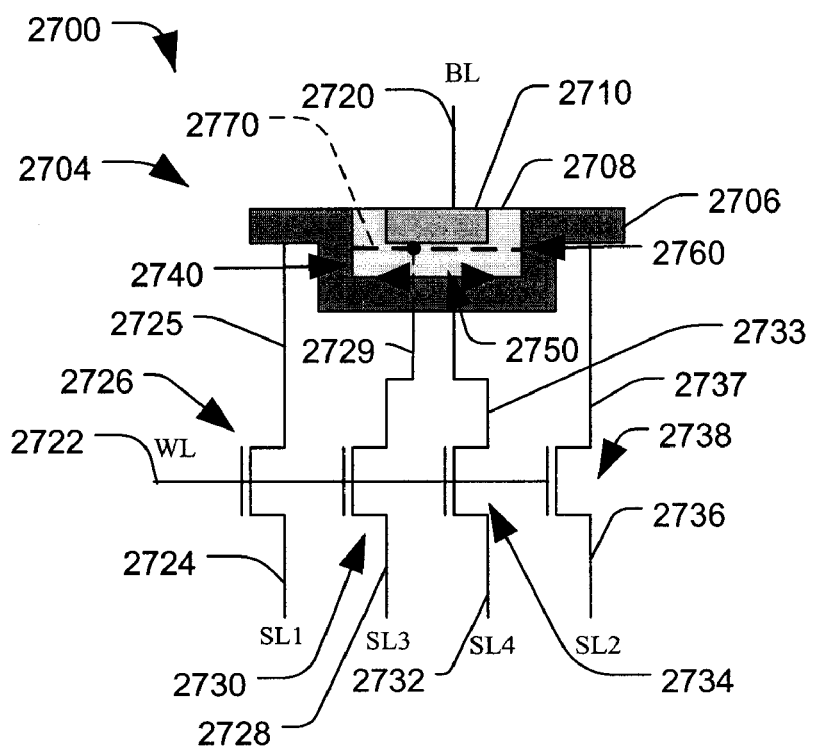
FIG. 27 is a diagram showing a cross-sectional view of a fifth embodiment of an MTJ cell adapted to store multiple data bits and coupled to multiple switches to read data from and to write data to the MTJ cell.

FIG. 27 is a diagram of a magnetic tunnel junction (MTJ) cell 2700 adapted to store multiple bits. The MTJ cell 2700 includes an MTJ structure 2704 including a bottom electrode 2706, an MTJ stack 2708, and a center electrode 2710. The MTJ stack 2708 includes a fixed magnetic layer, a magnetic tunnel junction barrier layer, and a free magnetic layer. The fixed magnetic layer may be pinned by an anti-ferromagnetic (AF) layer (not shown). The free magnetic layer carries a magnetic domain that can be changed using a write current to store a bit value. The MTJ cell 2700 may be a memory cell within a memory array, such as a magneto-resistive random access memory (MRAM), an N-way cache, a non-volatile storage device, other memory devices, or any combination thereof.

The MTJ stack 2708 includes a first sidewall 2740, a bottom wall 2750, a second sidewall 2760, and a third sidewall 2770 (shown in phantom). Each of the sidewalls 2740, 2760, and 2770 and the bottom wall 2750 carries a respective magnetic domain adapted to represent a bit value. The MTJ stack 2708 is coupled to a bit line 2720 via the top electrode 2710. The first sidewall 2740 of the MTJ stack 2708 is coupled to a first switch 2726 via the bottom electrode 2706. The first switch 2726 includes a first terminal 2725 that is coupled to a first portion of the bottom electrode 2706, a control terminal coupled to a word line 2722, and a second terminal 2724 coupled to a first source line (SL1). The second sidewall 2760 is coupled to a second switch 2738 via the bottom electrode 2706. The second switch 2738 includes a third terminal 2737 that is coupled to a second portion of the bottom electrode 2706, a second control terminal coupled to the word line 2722, and a fourth terminal 2736 coupled to a second source line (SL2). The third sidewall 2770 is coupled to a third switch 2730 via the bottom electrode 2706. The third switch 2730 includes a fifth terminal 2729 that is coupled to a third portion of the bottom electrode 2706 adjacent to the third sidewall 2770, a third control terminal coupled to the word line 2722, and a sixth terminal 2728 coupled to a third source line (SL3). The bottom wall 2750 is coupled to a fourth switch 2734 via the bottom electrode 2706. The fourth switch 2734 includes a seventh terminal 2733 that is coupled to a fourth portion of the bottom electrode 2706 adjacent to the bottom wall 2750, a fourth control terminal coupled to the word line 2722, and an eighth terminal 2732 coupled to a fourth source line (SL4).

In a particular embodiment, each of the source lines (SL1, SL2, SL3, and SL4) may be coupled to a common power source. In another particular embodiment, each of the source lines (SL1, SL2, SL3, and SL4) may be coupled to different power sources. In a particular embodiment, the first, second, third and fourth switches 2726, 2730, 2734, and 2738 may be activated to read and/or write data from and to the MTJ cell 2700. In another particular embodiment, the first, second, third and fourth switches 2726, 2730, 2734, and 2738 are coupled to respective word lines, which may be selectively activated to read and/or write data from and to the MTJ cell 2700.

Figure 28:
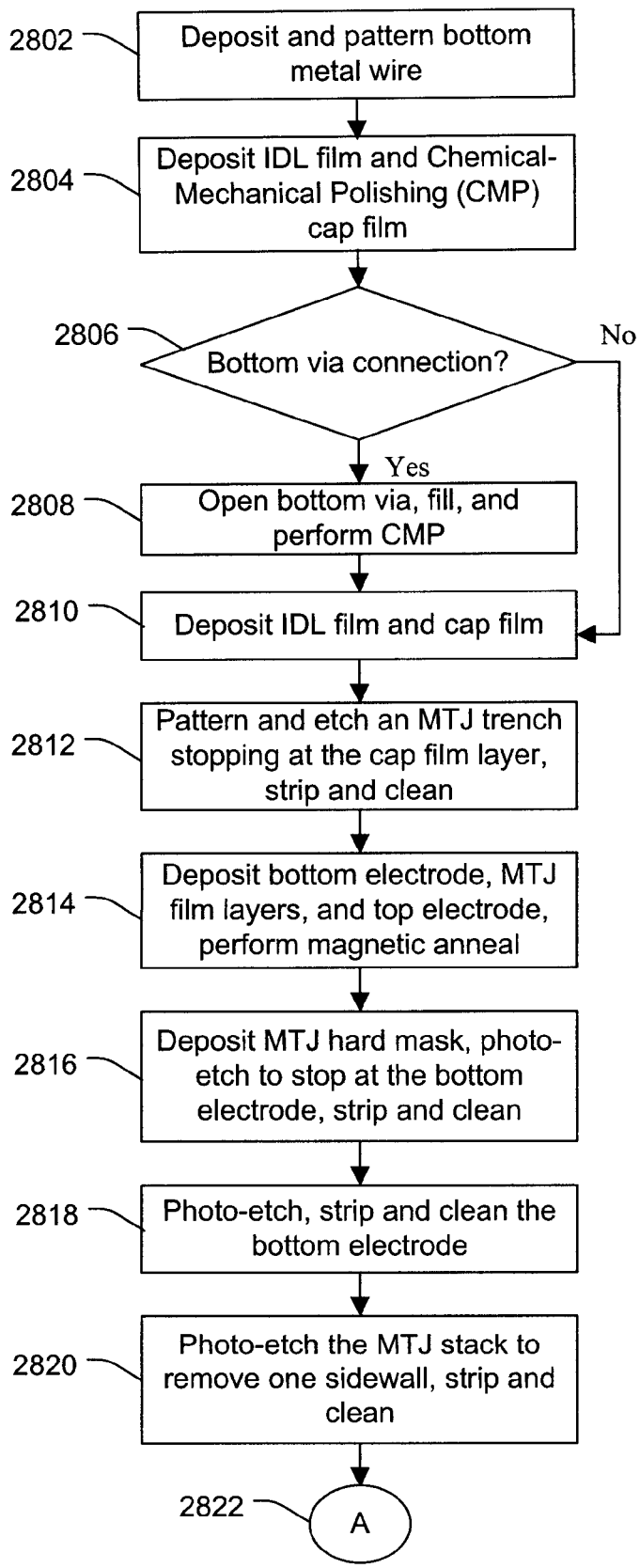
FIGS. 28-29 illustrate a flow diagram of a particular embodiment of a method of fabricating a magnetic tunnel junction (MTJ) device adapted to store multiple data bits.
Figure 29:
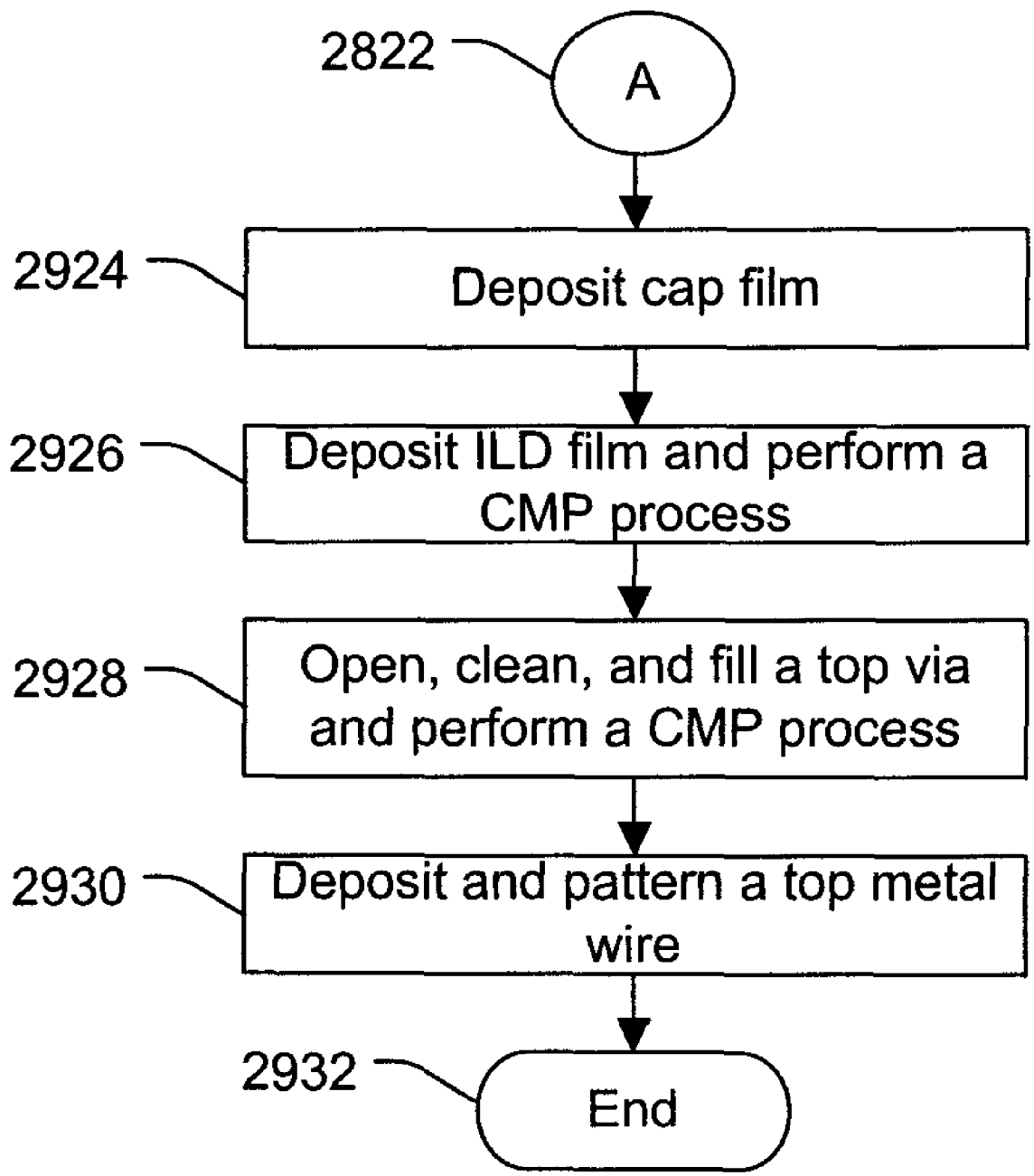

FIGS. 28-29 illustrate a flow diagram of a particular illustrative embodiment of a method of fabricating a magnetic tunnel junction (MTJ) structure to store multiple bits. In general, a depth of a trench for formation of the MTJ structure is tightly controlled. The MTJ film deposit is made and the top electrode thickness is controlled to form narrow turn gaps without seams. The magnetic anneal process is applied in two dimensions (e.g., along the (a) and (b) directions of FIG. 3, 6, 9, or 12 to initialize the bottom and the lateral magnetic domains with a fixed magnetic field direction). By controlling the shape of the cell and the depth of the cell, such that the length is greater than the width and the width is greater than the depth, a direction of the magnetic fields within the MTJ cell may be controlled. In a particular example, a large aspect ratio of the length to width and the width to depth can make the bottom MTJ and the sidewall MTJ magnetic domains more isotropic. In a particular embodiment, the MTJ stack structure is defined by a deep trench that simplifies a photo and etch process during fabrication.

At 2802, the method includes depositing and patterning a bottom metal wire. If a Damascene process is used, the bottom wire patterning should combine with underneath via process. Continuing to 2804, an inter-layer dielectric layer (IDL) film is deposited and a Chemical-Mechanical Polishing (CMP) is performed. A cap film layer is deposited. Advancing to 2806, if the circuit device includes a bottom via connection, the method proceeds to 2808 and a bottom via is opened, filled and via Chemical-Mechanical Polishing (CMP) process is performed. At 2806, if the circuit device does not include a bottom via connection, the method skips 2808 and advances to 2810. At 2810, IDL film and cap film layers are deposited. Proceeding to 2812, a magnetic tunnel junction (MTJ) trench is patterned and etched, stopping at the cap film layer, the photo resist (PR) is stripped and the trench is cleaned.

Continuing to 2814, a bottom electrode, MTJ film layers, and a top electrode are deposited, and a magnetic anneal is performed. Advancing to 2816, an MTJ hard mask is deposited and MTJ photo/etched to stop at the bottom electrode, and the photo resist (PR) are stripped and MTJ is cleaned. Proceeding to 2818, the bottom electrode is photo/etched, photo resist is stripped and the MTJ is cleaned. Moving to 2820, the MTJ stack is photo/etched to remove one or more sidewalls, stripped and cleaned. The method continues to 2822.

Turning to FIG. 29, at 2822, the method advances to 2924 and a cap film is deposited. Moving to 2926, an IDL film is deposited and a CMP process is performed. Continuing to 2928, a top via is opened, cleaned and filled and a via CMP process is performed. Proceeding to 2930, a top metal wire is deposited and patterned. If a Damascene process is used, the 2928 via and 2930 metal processes can be combined. The method terminates at 2932. In a particular embodiment, after deposition of the MTJ film layers, a magnetic anneal process may be performed, such as in a horizontal (a) direction and (b) direction as depicted in FIGS. 3, 6, 9, and 12 to configure the fixed magnetic domains of the fixed magnetic layer.

Figure 30:
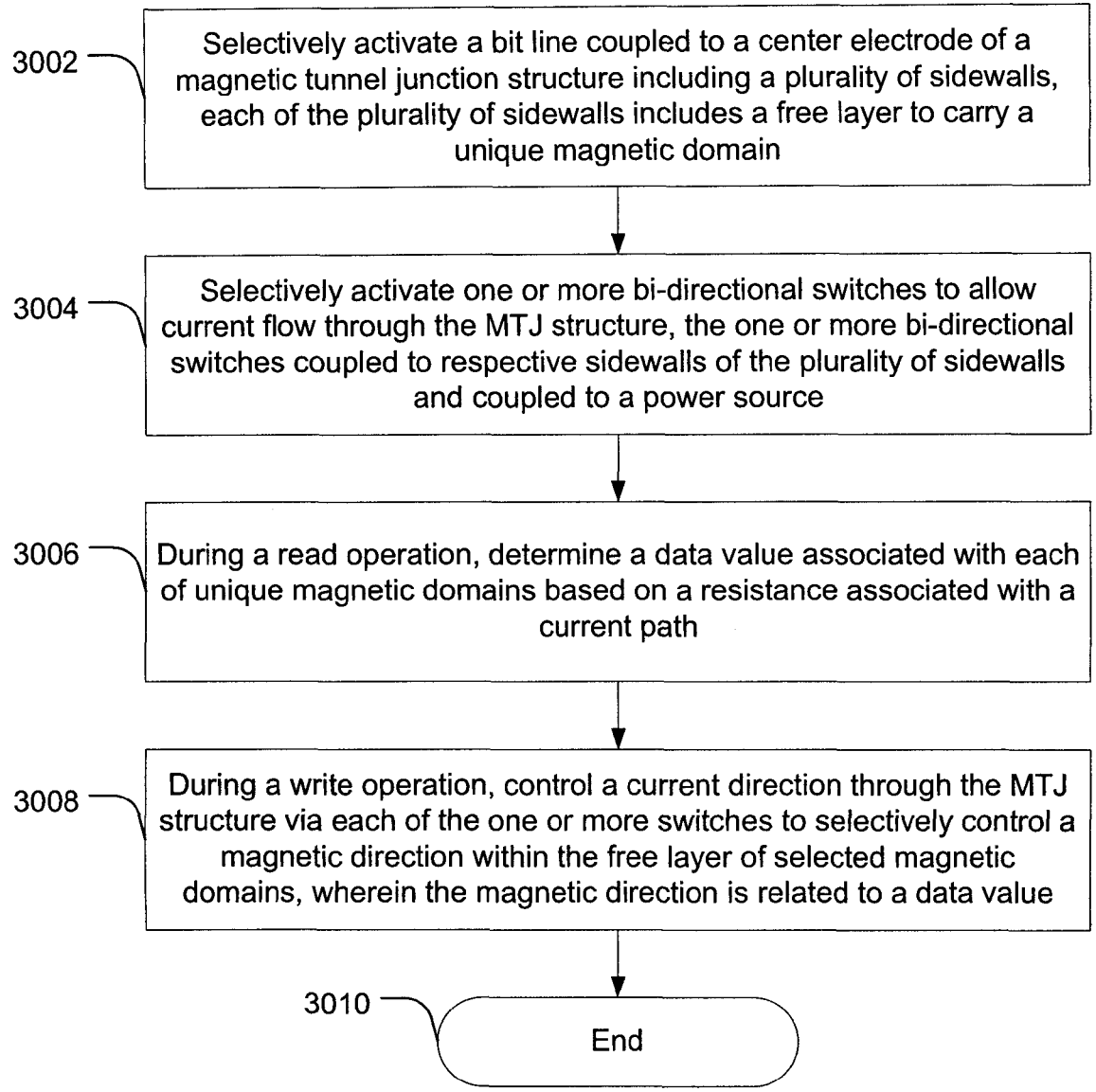
FIG. 30 is a flow diagram of a particular illustrative embodiment of a method of operating an MTJ device that is adapted to store multiple data bits.

FIG. 30 is a flow diagram of a particular illustrative embodiment of a method of accessing data stored at unique magnetic domains of a multi-bit MTJ cell. At 3002, the method includes selectively activating a bit line coupled to a center electrode of a magnetic tunnel junction structure including a plurality of sidewalls, where each of the plurality of sidewalls includes a free layer to carry a unique magnetic domain. Continuing to 3004, the method includes selectively activating the one or more bi-directional switches to allow current flow to the MTJ structure, where the one or more bi-directional switches are coupled to respective sidewalls of a plurality of sidewalls and coupled to a power source. In a particular embodiment, a bi-directional switch may also be coupled to a bottom wall. In a particular embodiment, the bi-directional switches may be coupled to multiple power sources. Moving to 3006, during the read operation, the method includes determining a data value associated with each of the unique magnetic domains based on the resistance associated with the current path. Proceeding to 3008, during a write operation, the method includes controlling a current direction through the MTJ structure via each of the one or more switches to selectively control a magnetic correction within a free layer of selective magnetic domains, where the magnetic direction is related to a bit value. The method terminates at 3010.

Figure 31:
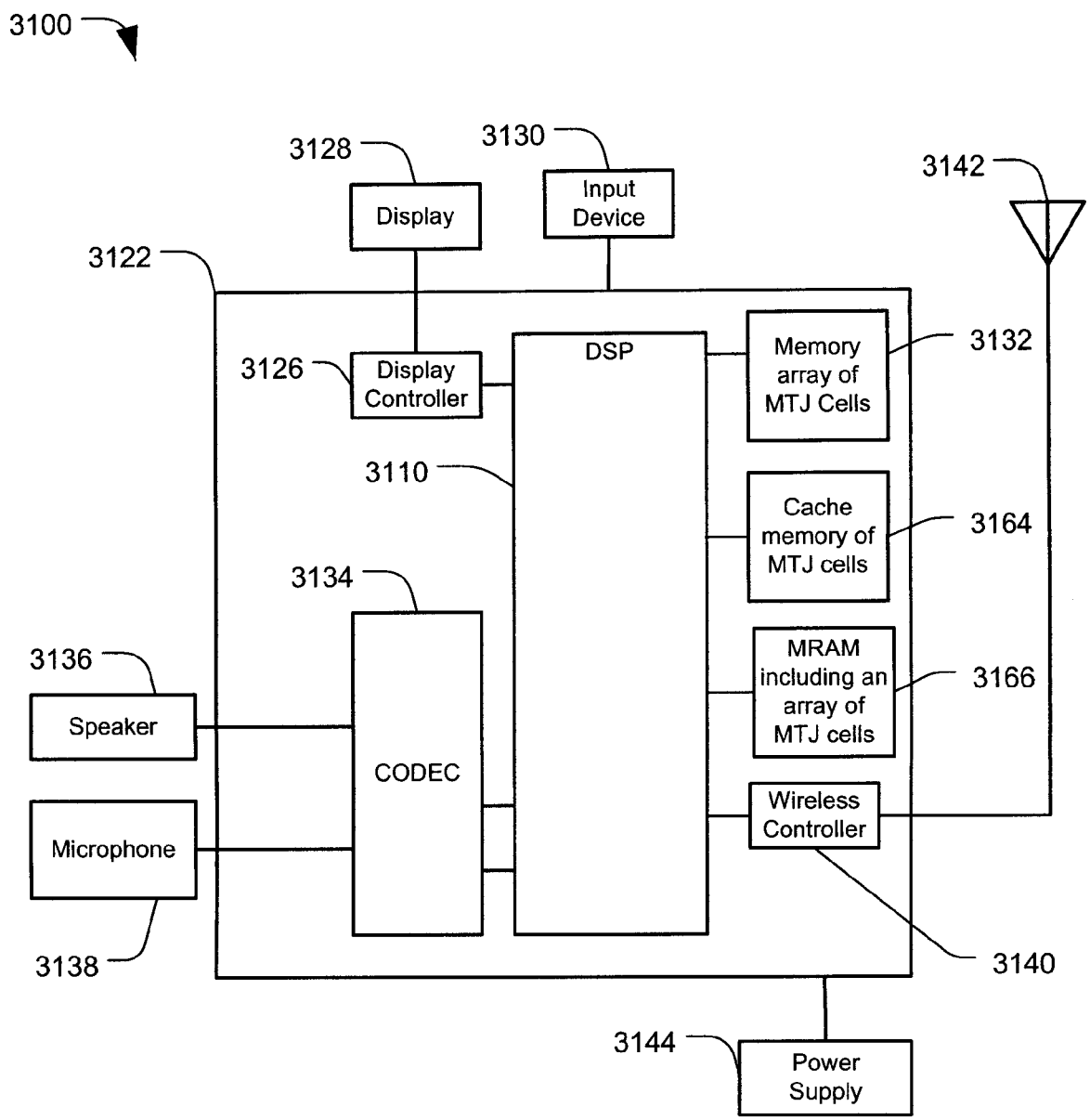
FIG. 31 is a block diagram of a wireless communications device including a memory device including multiple magnetic tunnel junction (MTJ) cells.

FIG. 31 is a block diagram of an illustrative embodiment of a communications device 3100 including a memory array of MTJ cells 3132 and a cache memory of MTJ cells 3164, which are coupled to a processor, such as a digital signal processor (DSP) 3110. The communications device 3100 also includes a magneto-resistive random access memory (MRAM) device 3166 that is coupled to the DSP 3110. In a particular example, the memory array of MTJ cells 3132, the cache memory of MTJ cells 3164, and the MRAM device 3166 include multiple MTJ cells, where each MTJ cell is adapted to store multiple independent bit values, as described with respect to FIGS. 1-30.

FIG. 31 also shows a display controller 3126 that is coupled to the digital signal processor 3110 and to a display 3128. A coder/decoder (CODEC) 3134 can also be coupled to the digital signal processor 3110. A speaker 3136 and a microphone 3138 can be coupled to the CODEC 3134.

FIG. 31 also indicates that a wireless controller 3140 can be coupled to the digital signal processor 3110 and to a wireless antenna 3142. In a particular embodiment, an input device 3130 and a power supply 3144 are coupled to the on-chip system 3122. Moreover, in a particular embodiment, as illustrated in FIG. 31, the display 3128, the input device 3130, the speaker 3136, the microphone 3138, the wireless antenna 3142, and the power supply 3144 are external to the on-chip system 3122. However, each can be coupled to a component of the on-chip system 3122, such as an interface or a controller.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope possible consistent with the principles and novel features as defined by the following claims.

What is claimed is:

1. A magnetic tunnel junction (MTJ) structure comprising: a MTJ cell comprising multiple sidewalls extending substantially normal to a surface of a substrate, each of the multiple sidewalls including a free layer to carry a unique magnetic domain, each of the unique magnetic domains adapted to store a digital value.

2. The MTJ structure of claim 1, further comprising a bottom wall coupled to each of the multiple sidewalls, the bottom wall extending substantially parallel to the surface of the substrate, the bottom wall including a free layer.

3. The MTJ structure of claim 2, wherein a magnetic domain wall is formed within the free layer between each of the multiple sidewalls, and wherein a magnetic domain wall is formed within the free layer between each of the multiple sidewalls and the bottom wall, the magnetic domain walls adapted to isolate the unique magnetic domains.

4. The MTJ structure of claim 1, wherein a depth of at least one of the multiple sidewalls is less than a distance between at least two of the multiple sidewalls.

5. The MTJ structure of claim 1, further comprising an electrode coupled to the MTJ cell, wherein the electrode is adapted to apply an electrical current to read data from or write data to the MTJ cell.

6. The MTJ structure of claim 1, wherein a depth of each of the multiple sidewalls is less than a length of each of the multiple sidewalls.

7. The MTJ structure of claim 1, wherein the MTJ cell comprises a first sidewall having a first magnetic domain, a second sidewall having a second magnetic domain and a third sidewall having a third magnetic domain.

8. The MTJ structure of claim 7, wherein the MTJ cell further comprises a bottom wall coupled to the first, second, and third sidewalls, the bottom wall including a free layer to carry a fourth magnetic domain.

9. The MTJ structure of claim 8, further comprising a first terminal structure coupled to the first sidewall, a second terminal structure coupled to the second sidewall, a third terminal structure coupled to the third sidewall, and a fourth terminal structure coupled to the bottom wall.

10. The MTJ structure of claim 1, wherein the MTJ cell is substantially U-shaped.

11. A magnetic tunnel junction (MTJ) structure comprising: a MTJ cell comprising multiple sidewalls, the multiple sidewalls including a first sidewall including a first free layer to carry a first magnetic domain to represent a first data bit and including a second sidewall including a second free layer to carry a second magnetic domain to represent a second data bit.

12. The MTJ structure of claim 11, wherein the first sidewall is substantially perpendicular to the second sidewall.

13. The MTJ structure of claim 11, wherein the first magnetic domain extends in a first direction that is substantially parallel to a surface of a substrate, and wherein the second magnetic domain extends in a second direction that is substantially parallel to the surface of the substrate.

14. The MTJ structure of claim 11, wherein the first magnetic domain extends in a direction that is substantially parallel to a planar surface of a substrate and wherein the second magnetic domain extends in a direction that is substantially perpendicular to the planar surface of the substrate.

15. The MTJ structure of claim 11, wherein the multiple sidewalls further comprise:
a third sidewall including a third free layer to carry a third magnetic domain to represent a third data bit; and
a bottom wall coupled to each of the multiple sidewalls, the bottom wall including a fourth free layer to carry a fourth magnetic domain to represent a fourth data bit.

16. The MTJ structure of claim 15, wherein the MTJ cell further includes a center electrode proximate to and spaced approximately equally from each of the multiple sidewalls and the bottom wall.

17. The MTJ structure of claim 16, wherein a thickness of the center electrode is approximately half of a difference between a width of the MTJ cell minus a width of two opposing sidewalls of the multiple sidewalls.

18. The MTJ structure of claim 16, further comprising:
a first terminal coupled to the center electrode,
a second terminal coupled to the first sidewall;
a third terminal coupled to the second sidewall;
a fourth terminal coupled to the third sidewall; and
a fifth terminal coupled to the bottom wall.

19. The MTJ structure of claim 11, further comprising:
a first terminal coupled to the first magnetic domain;
a second terminal coupled to the second magnetic domain; and
a third terminal coupled to a center electrode;
wherein the first terminal, the second terminal and the third terminal are adapted to cooperate to selectively write data to and read data from the first and second magnetic domains.

20. A magnetic random access memory (MRAM) comprising:
an array of magnetic tunnel junction (MTJ) cells, each of the MTJ cells comprising multiple sidewalls, each of the multiple sidewalls including a free layer to carry a respective independent magnetic domain adapted to store a digital value.

21. The MRAM of claim 20, wherein each of the MTJ cells comprises four independent magnetic domains.

22. The MRAM of claim 20, wherein each MTJ cell comprises:
a first sidewall including a first free layer to carry a first magnetic domain adapted to store a first bit;
a second sidewall including a second free layer to carry a second magnetic domain adapted to store a second bit;
a third sidewall including a third free layer to carry a third magnetic domain adapted to store a third bit; and
a bottom wall including a fourth free layer to carry a fourth magnetic domain adapted to store a fourth bit.

23. The MRAM of claim 22, further comprising:
a first switch coupled to the first sidewall;
a second switch coupled to the second sidewall;
a third switch coupled to the third sidewall;
a fourth switch coupled to the bottom wall;
a bit line coupled to a center electrode proximate to each of the sidewalls; and
a word line coupled to each of the first, second, third and fourth switches, the word line to selectively activate at least one of the first, second, third, and fourth switches to read data from and to write data to the MTJ cell.

24. The MRAM of claim 23, further comprising:
a first source line coupled to the first switch to selectively apply a first current to the first sidewall;
a second source line coupled to the second switch to selectively apply a second current to the second sidewall;
a third source line coupled to the third switch to selectively apply a third current to the third sidewall; and
a fourth source line coupled to the fourth switch to selectively apply a fourth current to the bottom wall;
wherein at least one of the first, second, third and fourth currents are applied during a data write operation.

25. The MRAM of claim 20, wherein each of the MTJ cells is substantially u-shaped.

* * * * *